US 12,124,166 B2

(12) United States Patent
Mukherjee et al.

(10) Patent No.: US 12,124,166 B2
(45) Date of Patent: Oct. 22, 2024

(54) NEGATIVE RESIST FORMULATION FOR PRODUCING UNDERCUT PATTERN PROFILES

(71) Applicant: Merck Patent GmbH, Darmstadt (DE)

(72) Inventors: Anupama Mukherjee, Woodbridge, NJ (US); Medhat A. Toukhy, Flemington, NJ (US)

(73) Assignee: Merck Patent GmbH, Darmstadt (DE)

( * ) Notice: Subject to any disclaimer, the term of this patent is extended or adjusted under 35 U.S.C. 154(b) by 917 days.

(21) Appl. No.: 16/496,986

(22) PCT Filed: Apr. 23, 2018

(86) PCT No.: PCT/EP2018/060272
§ 371 (c)(1),
(2) Date: Sep. 24, 2019

(87) PCT Pub. No.: WO2018/197379
PCT Pub. Date: Nov. 1, 2018

(65) Prior Publication Data
US 2020/0319555 A1 Oct. 8, 2020

Related U.S. Application Data

(60) Provisional application No. 62/489,634, filed on Apr. 25, 2017, provisional application No. 62/491,458, filed on Apr. 28, 2017.

(51) Int. Cl.
*G03F 7/11* (2006.01)
*C23C 14/04* (2006.01)
(Continued)

(52) U.S. Cl.
CPC ............ *G03F 7/0382* (2013.01); *C23C 14/04* (2013.01); *C23C 14/30* (2013.01); *C23C 14/34* (2013.01);
(Continued)

(58) Field of Classification Search
CPC .... G03F 7/0382; G03F 7/0045; G03F 7/0046; G03F 7/168; G03F 7/2004; G03F 7/322;
(Continued)

(56) References Cited

U.S. PATENT DOCUMENTS 4,485,167 A * 11/1984 Briney .................... G03F 7/027
522/16
5,654,128 A 8/1997 Hsu
(Continued)

FOREIGN PATENT DOCUMENTS

EP 0089041 B1 11/1987
EP 1033624 A1 9/2000
(Continued)

OTHER PUBLICATIONS

English Translation of JP 2003-005367 A; Toshio Banba; Published: Jan. 8, 2003 (Year: 2003).*
(Continued)

*Primary Examiner* — Mark F. Huff
*Assistant Examiner* — Richard David Champion
(74) *Attorney, Agent, or Firm* — Francis M. Houlihan

(57) ABSTRACT

A negative-acting, photoresist composition, imageable by 365 nm radiation that is developable in aqueous base. Apart from solvent, this composition comprises: a) an aqueous base soluble phenolic film-forming polymeric binder resin having ring bonded hydroxyl groups; b) a photoacid generator c) a crosslinking agent which comprises an etherified melamine; d) a dye as described herein; e) a quencher system consisting essentially of an amine quencher, or a mixture of such amine quenchers, as described. This invention also pertains to processes of using this composition as a photoresist.

30 Claims, 11 Drawing Sheets

(51) Int. Cl.
| | | |
|---|---|---|
| *C23C 14/30* | (2006.01) | |
| *C23C 14/34* | (2006.01) | |
| *G03F 7/004* | (2006.01) | |
| *G03F 7/038* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |

(52) U.S. Cl.
CPC .......... *G03F 7/0045* (2013.01); *G03F 7/0046* (2013.01); *G03F 7/168* (2013.01); *G03F 7/2004* (2013.01); *G03F 7/322* (2013.01); *G03F 7/38* (2013.01)

(58) Field of Classification Search
CPC .......... G03F 7/38; C23C 14/04; C23C 14/30; C23C 14/34
See application file for complete search history.

(56) References Cited

U.S. PATENT DOCUMENTS

| | | |
|---|---|---|
| 6,506,535 B1 | 1/2003 | Mizutani |
| 6,555,289 B2 | 4/2003 | Sasaki |
| 6,576,394 B1 | 6/2003 | Xu |
| 8,546,048 B2 | 10/2013 | Riege |
| 2004/0157154 A1 | 8/2004 | Kuroki |
| 2009/0111061 A1 | 4/2009 | Chau |
| 2010/0143830 A1 | 6/2010 | Ohashi |
| 2015/0024326 A1* | 1/2015 | Nawrocki ............... G03F 7/038 430/280.1 |
| 2017/0329220 A1* | 11/2017 | Kato ....................... G03F 7/038 |

FOREIGN PATENT DOCUMENTS

| | | | |
|---|---|---|---|
| EP | 1297386 B1 | 12/2006 | |
| EP | 2835687 A1 | 2/2015 | |
| EP | 3064997 A1 | 9/2016 | |
| JP | H07168355 A * | 7/1995 | ............... G03F 7/22 |
| JP | 2003005367 A * | 1/2003 | |
| JP | 2004-46157 A | 2/2004 | |
| JP | 2004-503830 A | 2/2004 | |
| JP | 2004-347736 A | 12/2004 | |
| JP | 2006-201332 A | 8/2006 | |
| JP | 2009-42643 A | 2/2009 | |
| JP | 2011-501815 A | 1/2011 | |
| JP | 2015052694 A * | 3/2015 | |
| JP | 2015-87609 A | 5/2015 | |
| WO | 00/08525 A1 | 2/2000 | |
| WO | 2016019212 A1 | 2/2016 | |

OTHER PUBLICATIONS

English Translation of JP 2015-052694 A; Katsumi Inomata; Published: Mar. 19, 2015 (Year: 2015).*

English Translation of JPH07168355A; Yasunori Kamiya; Published: Jul. 4, 1995 (Year: 1995).*

Microchip Fabrication-2nd Ed Microchip Fabrication: a practical guide to semiconductor processing by Peter Van Zant—Chapter 13, Metallization, p. 331, 1990.

M. Toukhy, et al., "High temperature negative tunable for new lift off applications", Advances in Resist Technology and Processing XXI Proceeding of SPIE vol. 5376 p. 924.

Munirathna Padmanaban, "Polymeric Dyes for Bottom Antireflective Coatings: A Review," Polymer News, 2003, vol. 28_p. 6-13.

Y. Chen et al., "Reliable fabrication of plasmonic nanostructures without an adhesion layer using dry lift-off", Nanotechnology 26, 2015, 405301_9 pp.

International Search Report, PCT/EP2018/060, date of mailing Aug. 9, 2018, corresponds to U.S. Appl. No. 16/496,986.

V.F. Traven, et al.—"Aryl(hetaryl)pyrazolines as new photoacid generators for optical information recording," Journal of Photochemistry and Photobiology A: Chemistry, 295, 2014, 34-39.

* cited by examiner

Example 5
(TME-triazine: HCl generating PAG)

Example 6
(PIW-501 sulfonic acid generating PAG)

Example 10
(Using N-Methyldipropylamine quencher)

Example 11
(Using N,N-diisopropylethylamine quencher)

Table 1: Composition of comparative examples 1, 2, 3, 4, 5 and examples 1, 2 and 3

| Component (wt% solids) | Comp Ex 1 | Comp. Ex 2 | Comp. Ex 3 | Comp. Ex 4 | Comp. Ex.5 | Ex. 1 | Ex. 2 | Ex 3 |
|---|---|---|---|---|---|---|---|---|
| CKS-670 | 75.94 | 77.69 | 76.98 | 78.93 | 78.939 | 76.199 | 76.98 | 77.42 |
| Cymel 301 | 15.17 | 15.5 | 15.38 | 15.58 | 15.788 | 15.018 | 15.181 | 15.03 |
| TME-triazine | 3.04 | 3.11 | 3.082 | 3.96 | 3.947 | 3.879 | 3.9 | 4.0 |
| Addi-MC (Monazoline-C) | 2.05 | -- | -- | 1.47 | 1.263 | 1.439 | 1.45 | 1.5 |
| R-2011 | | -- | -- | -- | 0.063 | | | |
| DI-Dye | 1.7 | 1.51 | 2.432 | -- | -- | 3.382 | 2.402 | 2.02 |
| DIPA | 2.05 | 2.098 | 2.08 | -- | -- | | | -- |
| APS-437 | 0.05 | 0.048 | 0.046 | 0.06 | -- | 0.083 | 0.076 | 0.03 |
| SB / PEB °C | 90/90 | 90/90 | 90/90 | 90/90 | 100/100 | 90/90 | 90/90 | 100/90 |
| % solids | 37.118 | 36.98 | 36.877 | 36.80 | 30.5 | 36.76 | 36.772 | 36 |
| Undercut/side (μ) | 1.5 | 1.7 | 2.9 | 2.7 | 0.35 | 4.0 | 13.2 | 6.6 |
| Film thickness | 3.5μ | 3.5μ | 3.5μ | 3.5μ | 4μ | 3.5μ | 3.5μ | 3.5μ |

FIG. 11

NEGATIVE RESIST FORMULATION FOR PRODUCING UNDERCUT PATTERN PROFILES

This application is a national stage application, filed under 35 U.S.C. § 371, of International Patent Application No. PCT/EP2018/060272, filed on Apr. 23, 2018, which claims the benefit of U.S. Provisional Patent Application No. 62/489,634, filed Apr. 25, 2017, and U.S. Provisional Patent Application No. 62/491,458, filed Apr. 28, 2017 each of which applications is incorporated herein by reference in their entirety.

FIELD OF INVENTION

The field of the invention pertains to a negative radiation-sensitive aqueous base soluble photoresist composition used for making integrated circuit (IC) and light emitting diode (LED) Devices

BACKGROUND

Photoresist compositions are used in microlithographic processes for making miniaturized electronic components such as in the fabrication of computer chips and integrated circuits. Generally, in these processes, a thin film of a photoresist composition is first applied to a substrate material, such as silicon wafers used for making integrated circuits. The coated substrate is then baked to evaporate solvent in the photoresist composition and to fix the coating onto the substrate. The baked, coated surface of the substrate is next subjected to an image-wise exposure to imaging radiation.

This radiation exposure causes a chemical transformation in the exposed areas of the coated surface. Visible light, ultraviolet (UV) light, electron beam and X-ray radiant energy are imaging radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

The use of a negative-working, acid-sensitive photoresist composition is known in the prior art. Most of such prior art photoresist compositions use a crosslinking agent that reacts with the polymeric binder resin to form an insoluble film comprising a higher molecular weight polymer The major development in resist products and chemistry has been devoted to the silicon integrated circuit (IC) chip industry. This technology moved from i-line lithography to shorter wave length (deep UV) lithographies, such as 248 nm, 193 nm and 157 nm in quest for higher resolution. Several generations of advanced deep UV resist materials have been developed. Critical dimensions (CD) well below 0.2 µm are achieved in production, applying 248 and 193 nm lithography based on chemically amplified resists.

However, applications, such as processing of GaAs or compound III-V substrates, light emitting diodes (LED), high powered LED and organic light emitting diodes (OLED), on the other hand, largely are still employing conventional i-line lithography and i-line resist materials which are not chemically amplified. For these applications Deposition of metal (a.k.a. metallization) on semiconductor substrates covered with patterned photoresist is frequently done by chemical vapor deposition (CVD) technologies such as LPCVD. Sputtering metal deposition may also be employed to deposit thick, uniform metal layers. Another technique employed for metallization is Vacuum Deposition (VD), in particular as induced by e-beam (EBPVD).

Electron beam physical vapor deposition, or EBPVD, is a form of physical vapor deposition in which a target anode is bombarded with an electron beam given off by a charged tungsten filament under high vacuum. The electron beam causes atoms from the target to transform into the gaseous phase. These atoms then precipitate into solid form, coating everything in the vacuum chamber (within line of sight) with a thin layer of the anode material.

Sputtering metal deposition is done in a vacuum chamber where an electrically grounded metallic target wafer is bombarded with electrically charged Argon gas, sputtering away the metal atoms and depositing them on a target wafer.

CVD metal deposition occurs by reaction of a reactive gas under reduced pressure with a either the semiconductor substrate, itself or by reaction with a second reactive gas producing in both scenarios a metal deposit. For instance, as non-limiting examples, in the first scenario $WF_6$ may affect deposition on a Silicon substrate by reaction with Si to produce a metallic W deposits and producing as a reaction product gaseous $SiF_6$ which is pumped away. An example of the second scenario is the gaseous reaction of $WF_6$ with $H_2$ to deposit metallic W and producing as a reaction product gaseous HF which is pumped away.

Using a patterned resist, either CVD or sputtering metal may be employed to metalize areas of substrate not covered by resist. However, subsequent to this step the remaining resist can be removed by either employing a chemical etchant or an adhesive tape applied to the surface of the resist to remove it. In either situation removal may be facilitated by employing a lift-off process is employed where the resist patterns were initially produced prior to metallization have an undercut at the resist substrate interface. In the case where a chemical etchant is employed, such as a stripper, removal of remaining resist is made easier because the undercut portion of the resist is not metallized allowing the stripper to attack the resist and remove it. Straight wall, resist profiles, and profiles with a poor undercut have significant metallization at the sidewalls of these profiles making removal of the resist with a stripper much more difficult or impossible. Similarly, when using a sticky tape approach to affect removal of the resist, the more pronounced the undercut of the profiles the easier these are to remove without leaving large amount of residual resist on the substrate. The minimization of this residue, in turn, allows for a faster removal of this residue in subsequent stripping operation. Traditional, approaches to getting sloped profiles which have some undercut resist characteristics for lift-off application, have depended upon the manipulation of optical conditions during exposure such as exposure tool defocus. Such "optical" approaches are inherently limited by the optical physics itself, in the extent of undercut which is possible.

There is a need for a high sensitivity i-line chemically amplified negative resist which gives, during imaging, a pronounced undercut where further this undercut has a significant exposure latitude during processing of the resist where these properties are imparted by the formulation itself during normal processing and do not depend upon optical manipulation of exposure tool parameters such as defocus settings. Herein is described a novel high sensitivity chemically amplified i-line photoresist formulation which unexpectedly, when exposed and processed, gives a pronounced undercut which has a wide exposure latitude. The pronounced undercut enabling for an easier lift off process after metallization of these resist patterns.

SUMMARY OF THE INVENTION

In one of its aspects, the present invention relates to a chemically-amplified, negative-acting, photoresist composition, imageable by 365 nm radiation that is developable in aqueous base, wherein the photoresist composition comprises, along with a solvent, the following solids components:
a) an aqueous base soluble phenolic film-forming polymeric binder resin having ring bonded hydroxyl groups.
b) a photoacid generator that forms an acid upon exposure to radiation at 365 nm, in an amount sufficient to initiate crosslinking of the film-forming binder resin.
c) a crosslinking agent that forms a carbonium ion upon exposure to the acid from step b) generated by exposure to radiation, and which comprises an etherified melamine.
d) a dye having a molar attenuation coefficient at 365 nm ranging from about $1.61 \times 10^4$ to about $1.07 \times 10^4$ mole$^{-1}$ L cm$^{-1}$.
e) a quencher system consisting essentially of an amine quencher, or a mixture of such amine quenchers, having a pKa in water from about 6.0 to about 12, where the amine quencher has a boiling point of at least 100° C., at 1 atmosphere pressure, and comprises at least one C2-C25 alkyl substituent, a —(CH$_2$)$_n$OH substituent, or a —(CH$_2$)$_n$O—(CH$_2$)$_n$'—O—R' substituent or comprises a mixture of these substituents, where n and n' are independently an integer ranging from 2 to 4 and R' is a C1-C4 alkyl or H.

Other aspects of this invention are the processes of coating on a substrate and imaging the above photoresist with 365 nm, or broadband radiation containing a 365 nm component, to produced features which have a large undercut profile with a good exposure latitude and also the processes of using such profile in a metallization/lift off approach.

BRIEF DESCRIPTION OF THE DRAWINGS

FIG. 11 shows Table 1, Describing the composition of the novel photoresist compositions, comparative compositions and summary of undercut performance by showing representative SEM cross-section pictures.

DETAILED DESCRIPTION

Figure 1:
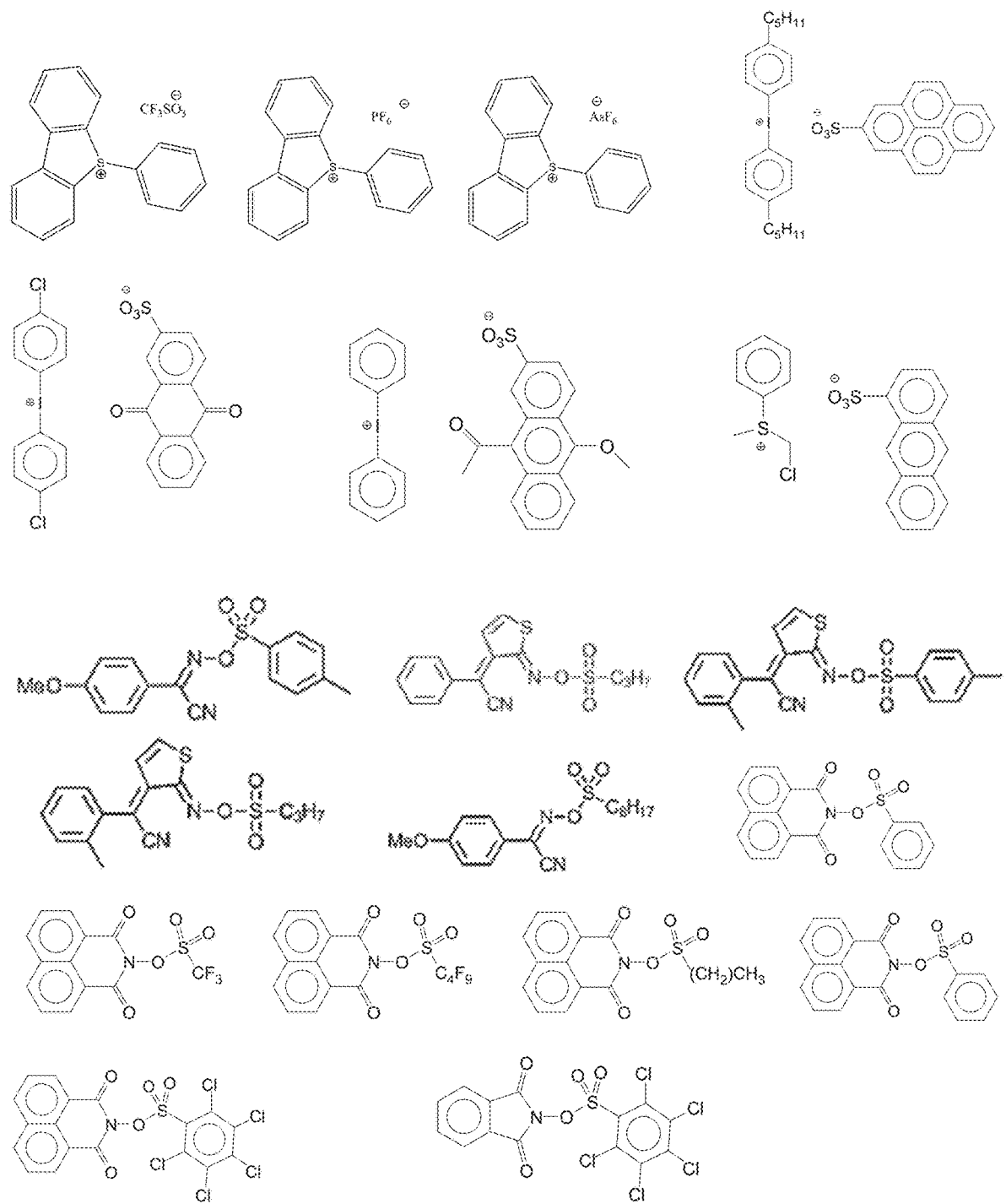
FIG. 1 Shows non-limiting examples of i-line (broadband) photoacid generators which generate sulfonic, and other strong acids.
Figure 2:
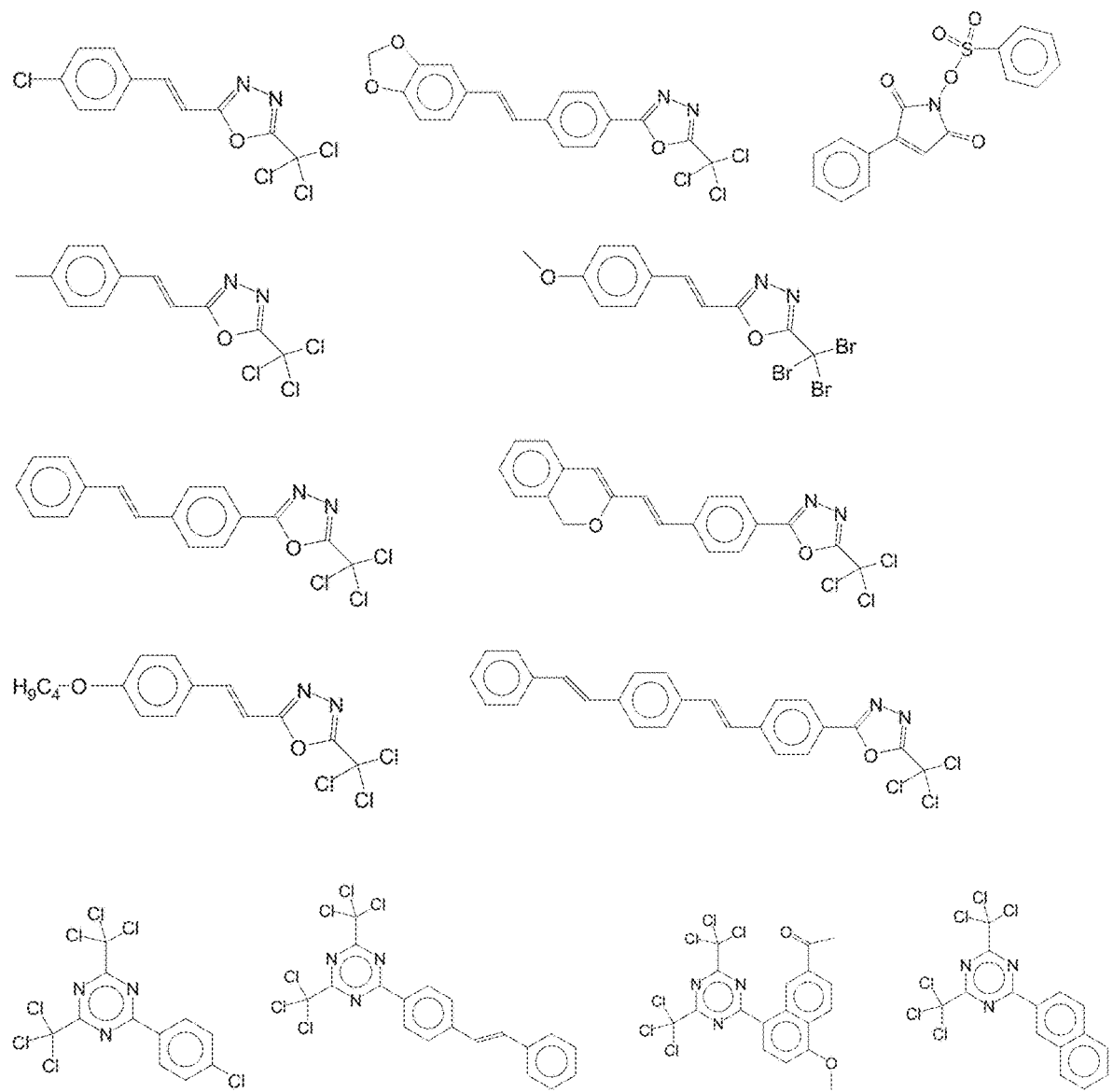
FIG. 2 Shows non-limiting examples of i-line (broadband) trihalo photoacid generators which generate either HCl or HBr.

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Herein, unless otherwise indicated, alkyl refers to hydrocarbon groups which can be linear, branched (e.g. methyl, ethyl, propyl, isopropyl, tert-butyl and the like) or cyclic (e.g. cyclohexyl, cyclopropyl, cyclopentyl and the like) multicyclic (e.g. norbornyl, adamantly and the like). These alkyl moieties may be substituted or unsubstituted as described below. The term alkyl refers to such moieties with C-1 to C-20 carbons. It is understood that for structural reasons linear alkyls start with C-1, while branched alkyls and linear start with C-3 and multicyclic alkyls start with C-5. Moreover, it is further understood that moieties derived from alkyls described below such as alkyloxy, haloalkyloxy have the same carbon number ranges unless otherwise indicated. If the length of the alkyl group is specified as other than described above, the above described definition of alkyl still stands with respect to it encompassing all types of alkyl moieties as described above and that the structural consideration with regards to minimum number of carbon for a given type of alkyl group still apply.

Alkyloxy (a.k.a. Alkoxy) refers to an alkyl group as defined above on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

Halo or halide refers to a halogen, F, Cl, Br, I which is linked by one bond to an organic moiety.

Haloalkyl refers to a linear, cyclic or branched saturated alkyl group such as defined above in which at least one of the hydrogens has been replaced by a halide selected from the group consisting of F, Cl, Br, I or mixture of these if more than one halo moiety is present. Fluoroalkyls are a specific subgroup of these moieties.

Fluoroalkyl refers to a linear, cyclic or branched saturated alkyl group as defined above in which the hydrogens have been replaced by fluorine either partially or fully (e.g. trifluoromethyl, pefluoroethyl, 2,2,2-trifluoroethyl, prefluoroisopropyl, perfluorocyclohexyl and the like). These fluoroalkyl moieties, if not perfluorinated, may be substituted or unsubstituted as described below.

Fluoroalkyloxy refers to a fluoroalkyl group as defined above on which is attached through an oxy (—O—) moiety it may be completed fluorinated (a.k.a. perfluorinated) or alternatively partially fluorinated (e.g. trifluoromethyoxy, perfluoroethyloxy, 2,2,2-trifluoroethoxy, perfluorocyclohexyloxy and the like). These fluoroalkyl moieties, if not pefluorinated may, be substituted or unsubstituted as described below.

Herein when referring to an alkyl, alkyloxy, fluoroalkyl, fluoroalkyloxy moieties with a possible range carbon atoms which starts with C-1 such as for instance "C-1 to C-20 alkyl," or "C-1 to C-20 fluoroalkyl," as non-limiting examples, this range encompasses linear alkyls, alkyloxy, fluoroalkyl and fluoroalkyloxy starting with C-1 but only designated branched alkyls, branched alkyloxy, cycloalkyl, cycloalkyloxy, branched fluoroalkyl, and cyclic fluoroalkyl starting with C-3.

Herein the term alkylene refers to hydrocarbon groups which can be a linear, branched or cyclic which has two or more attachment points (e.g. of two attachment points: methylene, ethylene, 1,2-isopropylene, a 1,4-cyclohexylene and the like; of three attachment points 1,1,1-substituted methane,1,1,2-substituted ethane, 1,2,4-substituted cyclohexane and the like). Here again, when designating a possible range of carbons, such as C-1 to C-20, as a non-limiting example, this range encompasses linear alkylenes starting with C-1 but only designates branched alkylenes, or cycloalkylene starting with C-3. These alkylene moieties may be substituted or unsubstituted as described below.

Herein the term Aryl or aromatic groups refers to such groups which contain 6 to 24 carbon atoms including phenyl, tolyl, xylyl, naphthyl, anthracyl, biphenyls, bisphenyls, tris-phenyls and the like. These aryl groups may further be substituted with any of the appropriate substituents e.g. alkyl, alkoxy, acyl or aryl groups mentioned hereinabove.

Herein the term arylene refers to a aromatic hydrocarbon moiety which has two or more attachment points (e.g. 2-5), this moiety may be a single benzene moiety (e.g. two attachment points 1,4-phenylene, 1,3-phenylene and 1,2-phenylene; three attachment points 1,2,4-substituted benzene, 1,3,5-substituted benzene and the like), a polycyclic aromatic moiety with two attachment points such derived from napthtalene, anthracene, pyrene and the like, or a multiple benzene rings in a chain which have two attachment point (e.g. biphenylene). In those instance, where the aromatic moiety is a fused aromatic ring, these may be called fused ring arylenes, and more specifically named, for instance, napthalenylene, anthracenylene, pyrenylene, and the like. Fused ring arylenes may be substituted or unsubstituted as described below, additionally these fused ring arylenes may also contain a hydrocarbon substituent which has two attachment sites on the fused ring forming an additional aliphatic or unsaturated ring forming by attachment to the fused ring a ring having 5-10 carbon atoms.

Herein, the term "PAG," unless otherwise described, refers to a photoacid generator that can generate under 365 nm and/or broadband radiation an acid (a.k.a. photoacid). The acid may be a sulfonic acid, HC1, HBr, $HAsF_6$, and the like.

Herein the term fused aromatic ring refers to a carbon based polycyclic aromatic compound containing 2-8 carbon based aromatic rings fused together (e.g. naphthalene, anthracene, and the like) these fused aromatic ring which may have a single attachment point to an organic moiety as part of an aryl moiety such as a pendant fused aromatic ring aryl group on a photoacid generator (PAG) or have two attachment points as part of an arylene moiety, such as, for instance, as in spacer in a substituent attached to a PAG. In PAG's, such substituents, along with other substituent that can interact by resonance delocalization, impart greater absorbance at 365 nm and/or broadband radiation and lead to more effective at these wavelengths.

Herein the term "arene," encompases aromatic hydrocarbon moieties containing 1 ring or 2-8 carbon based aromatic rings fused together.

Herein the term "heteroarene," refers to an arene which contains 1 or more trivalent or divalent heteroatoms respectively in such a way as to retain its aromaticity. Examples of such hetero atoms are N, O, P, and S. As non-limiting examples, such heteroarenes may contain from 1 to 3 such hetero atoms.

Unless otherwise indicated in the text, the term "substituted" when referring to an aryl, alkyl, alkyloxy, fluoroalkyl, fluoroalkyloxy, fused aromatic ring, arene, heteroarene refers to one of these moieties which also contain with one or more substituents, selected from the group consisting of unsubstituted alkyl, substituted alkyl, unsubstituted aryl, alkyloxyaryl (alkyl-O-aryl-), dialkyloxyaryl ((alkyl-O—)$_2$-aryl), haloaryl, alkyloxy, alkylaryl, haloalkyl, halide, hydroxyl, cyano, nitro, acetyl, alkylcarbonyl, formyl, ethenyl ($CH_2$=CH—), phenylethenyl (Ph-CH=CH—), arylethenyl (Aryl-CH=CH—), and substituents containing ethenylenearylene moieties (e.g. Ar(—CH=CH—Ar—)$_z$ where z is 1-3. Specific non-limiting examples of substituted aryl and substituted aryl ethenyl substituent are as follows:

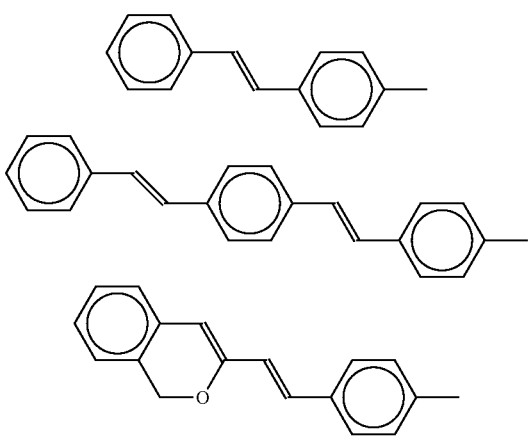

Otherwise, substituted aryl, and substituted ethenyls, where the substituent is selected from any of the above substituents. Similarly, the term "unsubstituted" refers to these same moieties, wherein no substituents apart from hydrogen is present.

The term "quencher system," refers to an assembly of basic components, such as amines, which in a resist formulation could act to capture an acid generated by a photoacid generator during exposure to i-line or broadband radiation.

The term "solid components," refers to components in a photoresist formulation which are not the solvent. Such components may be solids or liquids.

The present invention relates to a chemically amplified, negative-acting, radiation-sensitive aqueous base soluble photoresist composition and to a method for producing microelectronic devices using such a photoresist which is particularly useful for photoresists having applicability in lift-off applications employed in metallization processing in the manufacture of conventional IC devices and LED devices. The photoresists of the present invention comprise a phenolic film-forming binder resin having ring bonded hydroxyl groups, an etherified melamine cross linking agent, a photoacid generator, a dye, and an amine quencher, where the specific combination of amine quencher and dye is selected to provide good photoresist properties for the aforementioned lift-off applications.

In one of its embodiments, the present invention relates to a chemically-amplified, negative-acting, photoresist composition, imageable by 365 nm radiation that is developable in aqueous base, the photoresist composition comprising solids components a), b), c) d) and e) and solvent component f);
  a) an aqueous base soluble phenolic film-forming polymeric binder resin having ring bonded hydroxyl groups;
  b) a photoacid generator that forms an acid upon exposure to radiation at 365 nm, in an amount sufficient to initiate crosslinking of the film-forming binder resin;
  c) a crosslinking agent that forms a carbonium ion upon exposure to the acid from step b) generated by exposure to radiation, and which comprises an etherified melamine;
  d) a dye having a molar attenuation coefficient at 365 nm ranging from about $1.74 \times 10^4$ to about $0.94 \times 10^4$ mole$^{-1}$ L cm$^{-1}$ as measured in PGMEA;
  e) a quencher system consisting essentially of an amine quencher, or a mixture of such amine quenchers, having a pKa in water from about 6.0 to about 12, where the amine quencher has a boiling point of at least 100° C., at 1 atmosphere pressure, and is substituted with a C2-C25 alkyl substituent, a —$(CH_2)_n$OH substituent, —$(CH_2)_n$—O—$(CH_2)_{n'}$—O—R' or a mixture of these substituents, where n and n' are independently an integer ranging from 2 to 4 and R' is a C1-C4 alkyl or H; and
  f) a photoresist solvent.

In certain embodiments described herein, of this inventive composition, no other amine quenchers are present, apart from those designated in the quencher system, as outlined in solid component e) above. Specifically, it has been found that the presence of amines with a pKa below about 6.0 can lead to the loss of the ability of the novel photoresist composition, when coated on a substrate and lithographically processed, to form resist imaged resist profiles with large amount of undercut at the substrate resist film interface, where undercut extent has a large exposure latitude. In another aspect of this, low boiling point amines having a boiling point below about 100° C. are also undesirable, as they may easily be lost from the resist film during photoresist coating and associated baking steps used in processing the resist before and after exposure to radiation.

In another embodiment of the above photoresist composition, and further photoresist compositions described herein, said solid component d), the dye, said molar attenuation coefficient ranges from about $1.61 \times 10^4$ to about $1.07 \times 10^4$ mole$^{-1}$ L cm$^{-1}$. In another embodiment said molar attenuation coefficient ranges from about $1.47 \times 10^4$ to about $1.27 \times 10^4$ mole$^{-1}$ L cm$^{-1}$. In yet another embodiment about $1.41 \times 10^4$ to about $1.27 \times 10^4$ mole$^{-1}$ L cm$^{-1}$. In yet another embodiment from about $1.37 \times 10^4$ to about $1.31 \times 10^4$ mole$^{-1}$ L cm$^{-1}$. In yet another embodiment from about $1.36 \times 10^4$ to about $1.32 \times 10^4$ mole$^{-1}$ L cm$^{-1}$. In a final embodiment said molar attenuation coefficient, as measured in PGMEA, is about $1.34 \times 10^4$ mole$^{-1}$ L cm$^{-1}$.

In another embodiment of the above photoresist composition said solid component e), said quencher system, consists only of an amine quencher, or a mixture of such amine quenchers, having a pKa in water from about 6.0 to about 12, where the amine quencher has a boiling point of at least 250° C., at 1 atmosphere pressure, and comprises at least one C2-C25 alkyl substituent, a —$(CH_2)_n$OH substituent, or a —$(CH_2)_n$—O—$(CH_2)_{n'}$—O—R' substituent or comprises a mixture of these substituents, where n and n' are independently an integer ranging from 2 to 4 and R' is a C1-C4 alkyl or H.

In another embodiment of the above photoresist composition said solid component e), said quencher system, consists only of an amine quencher, or a mixture of such amine quenchers, having a pKa in water from about 6.0 to about 12, where the amine quencher has a boiling point of at least 100° C., at 1 atmosphere pressure, and comprises at least one C2-C25 alkyl substituent, —$(CH_2)_n$OH substituent, or —$(CH_2)_n$—O—$(CH_2)_{n'}$—O—R' substituent or a mixture of these substituents, where n and n' are independently an integer ranging from 2 to 4 and R' is a C1-C4 alkyl or H.

In another embodiment of the above photoresist composition said solid component e), said quencher system, consists only of an amine quencher, or a mixture of such amine quenchers, having a pKa in water from about 6.0 to about 12, where the amine quencher has a boiling point of at least 100° C., at 1 atmosphere pressure, and comprises at least one C10-C25 alkyl substituent, or —$(CH_2)_n$OH substituent, or a mixture of these substituents, where n is an integer ranging from 2 to 4.

In another embodiment of the above composition, said solid component e) is one, wherein, further, said amine quencher, or a mixture of such amine quenchers, where the amine quencher has a boiling point of at least 100° C., at 1 atmosphere pressure, are ones having structure (1), wherein $R_1$, and $R_{1a}$ may be individually selected from H, a C1 to C5 alkyl, or an aryl, where further at least one of $R_1$, and $R_{1a}$, is C10 to C25 alkyl substituent, or a —$(CH_2)_n$OH substituent, wherein n is an integer ranging from 2 to 4, and further wherein position 3 and 2 are connected by either a single bond or a double bond. In other aspects of this embodiment the quencher has a boiling point of at least 150° C., in another at least 200° C., in another at least 250° C. and in yet another embodiment at least 300° C.

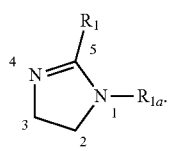

(1)

In another embodiment of the above photoresist composition, said solid component d), said dye, is soluble in aqueous base; and further wherein said solid component e) is one, wherein, further, said amine quencher or a mixture of such amine quenchers are ones having structure (1), wherein $R_1$, and $R_{1a}$ may be individually selected from H, a C1 to C5, alkyl, or an aryl, where further at least one of $R_1$, and $R_{1a}$, is C10 to C25 alkyl substituent, or a —$(CH_2)_n$OH substituent, wherein n is an integer ranging from 2 to 4, and further wherein position 3 and 2 are connected by either a single bond or a double bond.

In another embodiment of the above composition, said solid component b), said photoacid generator, is a photoacid generator based on a trihalomethyl derivative (halo=Cl or Br) that forms an acid upon exposure to radiation at 365 nm and/or broadband radiation, in an amount sufficient to initiate crosslinking of the film-forming binder resin, wherein the halo moiety is chlorine or bromine; and further wherein said solid component e) is one wherein, further, said amine quencher or a mixture of such amine quenchers are ones having structure (1), wherein $R_1$, and $R_{1a}$ may be individually selected from H, a C1 to C5, alkyl, or an aryl, where further at least one of $R_1$, and $R_{1a}$, is C10 to C25 alkyl substituent, or a —$(CH_2)_n$OH substituent, wherein n is an integer ranging from 2 to 4, and further wherein position 3 and 2 are connected by either a single bond or a double bond In another embodiment of the above photoresist composition, said solid component b), said photoacid generator, is a photoacid generator based on a trihalomethyl derivative (halo=Cl or Br) that forms an acid upon exposure to radiation at 365 nm, in an amount sufficient to initiate crosslinking of the film-forming binder resin, wherein the halo moiety is chlorine or bromine; and further wherein said solid component e) is one wherein, further, said amine quencher or a mixture of such amine quenchers are ones having structure (1), wherein $R_1$, and $R_{1a}$ may be individually selected from H, a C1 to C5, alkyl, or an aryl, where further at least one of $R_1$, and $R_{1a}$, is C10 to C25 alkyl substituent, or a —$(CH_2)_n$OH substituent, wherein n is an integer ranging from 2 to 4, and further wherein position 3 and 2 are connected by either a single bond or a double bond.

In any of the above photoresist compositions said solid component a), said binder resin, may be a base soluble Novolak. Non-limiting examples of base soluble Novolaks comprise repeat units having bridges and phenolic compounds. Suitable phenolic compounds include, without limitation, phenols, cresols, substituted and unsubstituted resorcinols, xylenols, substituted and unsubstituted benzene triols, and combinations thereof. Specific non-limiting examples of suitable phenols are Bisphenol A, Bisphenol F, Bisphenol AP, Bisphenol AF, Bisphenol B, Bisphenol BP, Bisphenol C, Bisphenol E, Bisphenol S, phenol, meta-cresol, para-cresol, ortho-cresol, 3,5-dimethylphenol, 3-ethylphenol, 4-ethylphenyl, 3,5-diethylphenol, and combinations thereof. Novolak polymers are produced, usually, with an acid catalyst, by condensation polymerization of phenolic compounds and aldehydes such as formaldehyde, acetaldehyde or substituted or unsubstituted benzaldehydes or condensation products of phenolic compounds and substituted or unsubstituted methylol compounds. Bridges described supra may comprise methylene groups or methyne groups. Novolak polymers can also be made as condensation products of ketones such as acetone, methyl ethyl ketone, acetophenone and the like. Catalysts may include Lewis acids, Bronstead acids, dicationic and tricationic metal ions and the like. For example, without limitation, aluminum chloride, calcium chloride, manganese chloride, oxalic acid, hydrochloric acid, sulfuric acid, methane sulfonic acid trifluoromethane sulfonic acid or combinations comprising any of the foregoing may be used. Examples of suitable Novolak polymers include those obtained by the condensation reaction between a phenolic compound such as phenol, o-cresol, m-cresol, p-cresol, 2-5-xylenol, Bisphenol A, bisphenol F, Bisphenol AP, Bisphenol AF, Bisphenol B, Bisphenol BP, Bisphenol C, Bisphenol E, Bisphenol S, phenol, meta-cresol, para-cresol, ortho-cresol, 3,5-dimethylphenol, 3-ethylphenol, 4-ethylphenyl, 3,5-diethylphenol, and and the like with an aldehyde compound such as formaldehyde in the presence of an acid or multivalent metal-ion catalyst. An exemplary weight average molecular weight for the alkali-soluble Novolak polymer may be in the range from 1,000 to 30,000 Daltons. A further exemplary weight average molecular weight may be from 1,000 to 20,000 Daltons. A still further exemplary weight average molecular weight may be from 1,500 to 10,000 Daltons. Exemplary bulk dissolution rates for Novolak polymers in 2.38% aqueous tetramethylammonium hydroxide are 10 Å/sec (Angstrom units per second) to 15,000 Å/sec. Further exemplary bulk dissolution rates are 100 Å/sec to 10,000 Å/sec. Still further exemplary bulk dissolution rates are 200 Å/sec to 5,000 Å/sec. A still further exemplary bulk dissolution rate of 1,000 Å/sec may be obtained from a single Novolak polymer or a blend of Novolak polymers, each comprising m-cresol repeat units. Exemplary cresylic Novolak polymers may comprise, in cresol mole percentage terms, 0%-60% p-cresol, 0%-20% o-cresol, and 0%-80% m-cresol. Further exemplary cresylic Novolak polymers may comprise 0%-50% p-cresol, 0%-20% o-cresol, and 50%-100% m-cresol. Repeat units in Novolak polymers are defined by the composition of the polymer, so that, for example, p-cresol may be introduced by polymerization with an aldehyde or by dimethylol-p-cresol. Moreover, cresylic Novolak polymers may contain other phenolic compounds such as phenol, xylenols, resorcinols, benzene triols and the like.

In one embodiment of the above composition, wherein said solid component a), said binder resin, is a base soluble Novolak, derived from the copolymerization of Bisphenol A, formaldehyde and meta-cresol. The binder resin comprises repeat units having general structure (2), wherein q represents the number of repeat units in the polymer chain and attachment of the —$CH_2$— repeat unit may be at ortho or para positions. The binder resin may also contain branched structures in which an additional 1 to 2 ortho-positions on the repeat unit derived from Bisphenol A are linked to a —CH$_2$— repeat unit attached to another repeat unit derive from either meta-cresol or Bisphenol A. Further, an additional meta or para position on the repeat unit derived from meta-cresol can be linked to a —CH$_2$— repeat unit attached to another repeat unit derived from either meta-cresol or Bisphenol A.

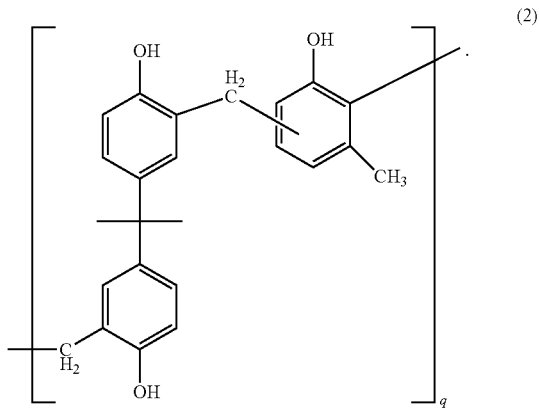

(2)

In one embodiment of the Novolak, having structure (2), it has an Mw ranging from about 20,000 to about 5,000 with a polydispersity (PD) ranging from about 3 to about 5. In another embodiment of this aspect of the invention the Novolak has an Mw ranging from about 15,000 to about 3,000. In another embodiment Mw is from about 12,000 to about 5,000. In yet another embodiment Mw is from about 11,000 to about 7,000. In still another embodiment Mw is from about 10,000 to about 8,000. In another embodiment, the Mw is about 9,000 and the PD is about 4.1.

In one embodiment of the above photoresist composition, said solid component b), said photoacid generator (PAG) are ones where the photoacid generator is one which generates, upon 365 nm and/or broadband irradiation, a photoacid such as a sulfonic acid, such as alkylsulfonic acid, aryl sulfonic acid or fluoroalkylsulfonic acid, perfluorosulfonic acid, inorganic acid such as HAsF$_6$, HSbF$_6$, HPF6, or acid derived from tetra(perfluorophenyl)borates, H(perf-Ph)$_4$B, or similar tetra(perfluoroaryl)borates, H(perf-Aryl)$_4$B. Non limiting examples of such PAG's are such photoacid generator include a variety of photoacid generators, such as onium salts, dicarboximidyl sulfonate esters, oxime sulfonate esters, diazo(sulfonyl methyl) compounds, disulfonyl methylene hydrazine compounds, nitrobenzyl sulfonate esters, biimidazole compounds, diazomethane derivatives, glyoxime derivatives, β-ketosulfone derivatives, disulfone derivatives, sulfonic acid ester derivatives, imidoyl sulfonate derivatives, compounds, diazonaphthoquinone sulfonate esters or combinations thereof. Such photoacid generators may inherently be sensitive to 365 nm and/or broadband radiation by appropriate substitution as known in the art. More specifically, these may, for instance, as non-limiting examples, be substituted or unsubstituted triarylsulfonium salt of an organic sulfonic acids, wherein in the triarylsulfonium moiety or its corresponding acid anion contains at least one aryl moiety which has a conjugated aryl, wherein the conjugated aryl moiety is either selected from a phenyl ring with at least one substituent selected from the aryloxy, alkyloxy, nitro, cyano, acetyl, aryl, alkenyl, alkyloxyaryl (alkyl-O-aryl-), dialkyloxyaryl ((alkyl-O—)$_2$-aryl), or wherein the conjugated aryl moiety, alternatively, is a substituted or unsubstituted fused aromatic ring moiety containing 2 to 4 rings. Such substituents may be attached through a difunctional moiety capable of undergoing a resonance delocalization, such as arylene, including arylenes derived from a fused aromatic, or for example ethenylene (—C═C—) moieties. ethenyl (CH$_2$═CH—), phenylethenyl (Ph-CH═CH—), arylethenyl (Aryl-CH═CH—), and substituents containing ethenylenearylene moieties (e.g. Ar(—CH═CH—Ar—)$_z$ where z is 1-3. Specific non-limiting examples of substituted aryl and substituted aryl ethenyl substituent are as follows:

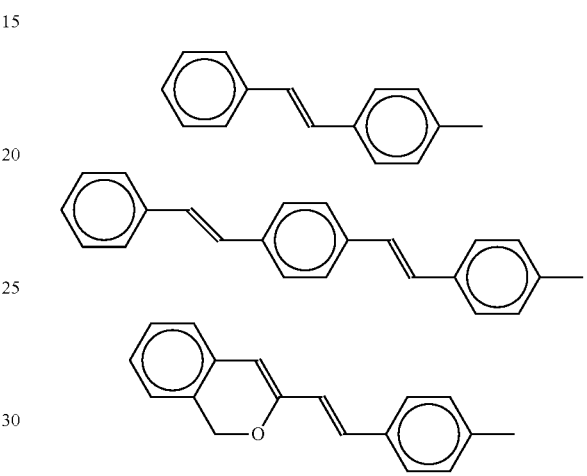

Other common PAG's sensitive to 365 nm and/or broadband radiation are substituted or unsubstituted 1,3-dioxo-1H-benzo[de]isoquinolin-2(3H)-yl ester organic sulfonic acids. FIG. 1 shows non-limiting examples of the above described PAG's. These PAG's may also have substituents as described above.

In another embodiment of this photoresist composition, the photoacid generator may also be one which is not directly sensitive to i-line or broadband radiation, but which has been sensitized to this radiation with photosensitizers that extend the effective wavelength and/or energy range. Such photosensitizers may be, without limitation, substituted and unsubstituted anthracenes, substituted and unsubstituted phenothiazines, substituted and unsubstituted perylenes, substituted and unsubstituted pyrenes, and aromatic carbonyl compounds, such as benzophenone and thioxanthone, fluorene, carbazole, indole, benzocarbazole, acridone chlorpromazine, equivalents thereof or combinations of any of the foregoing.

In another embodiment of this invention, said solid component b) is said trihalomethyl derivative, and it may be one which contains 1 to 3 trihalomethyl substituents. In another embodiment of this aspect of the invention, the trihalomethyl derivative is an arene or substituted arene containing from 1 to 3 trihalomethyl substituents. In another aspect of this embodiment said trihalomethyl derivative may be one which contains 1 to 3 trihalomethyl substituents which are attached to said arene or substituted arene moiety through a sulfone spacer (—SO$_2$—).

In another embodiment of this invention, wherein said solid component b) is said trihalomethyl derivative, it may be a trihalomethyl derivative of a heteroarene or substituted heteroarene containing 1 to 3 trihalomethyl moieties.

In another embodiment of this invention, wherein said solid component b) is said trihalomethyl derivative, it may be a derivative of an heteroarene or substituted heteroarene containing from 1 to 3 trihalomethyl substituents which are attached to said heteroarene or substituted heteroarene through a sulfone spacer (—SO$_2$—).

In another embodiment of this invention, wherein said solid component b) is said trihalomethyl derivative, it may be a derivative having structure (3), wherein R$_2$ is a substituted or unsubstituted alkenyl or substituted or unsubstituted aryl group, or a substituted or unsubstituted fused aromatic ring moiety containing 2 to 4 rings and Y is oxygen or nitrogen and X is Cl or Br.

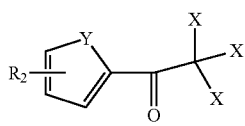

(3)

In another embodiment of this invention, wherein said solid component b) is said trihalomethyl derivative, it is a derivative of an oxazole or substituted oxazone having structure (4), wherein R$_3$ is a substituted or unsubstituted alkenyl or substituted or unsubstituted aryl group, and X is Cl or Br.

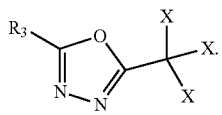

(4)

In another embodiment of this invention, wherein said solid component b) is said trihalomethyl derivative, it may be a trihalomethyl derivative of a substituted triazine containing 1 or 2 trihalomethyl moieties.

In another embodiment of this invention, wherein said solid component b) is said trihalomethyl derivative, it may be a trihalo methyl derivative having structure (5), wherein X is Br or Cl and R$_4$ is a unsubstituted or substituted alkenyl, an unsubstituted aryl or a substituted aryl moiety, or a substituted or unsubstituted fused aromatic ring moiety containing 2 to 4 rings.

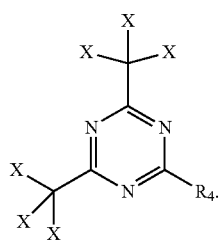

(5)

In another embodiment of this invention, wherein said solid component b) is said trihalomethyl derivative, it may be a derivative having structure (6), and R$_{4a}$ is a unsubstituted or substituted alkenyl or an unsubstituted aryl or substituted aryl moiety.

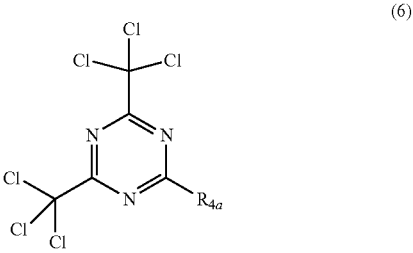

(6)

In another embodiment of this invention, wherein said solid component b) is said trihalomethyl derivative, it may be a derivative having structure (7), wherein, o is 1 or 2, X is Cl or Br, and further wherein R$_5$ is a C4 or C5 cyclic aliphatic ether moiety containing one or two olefin bounds which is substituted by hydrogen or a C1 to C2 alkyl.

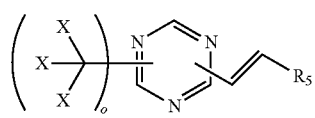

(7)

In another embodiment of this invention, wherein said solid component b) is said trihalomethyl derivative, which may be a derivative having structure (8), wherein, o is 1 or 2, X is Cl or Br and R$_6$ is hydrogen or a C1 to C3 alkyl.

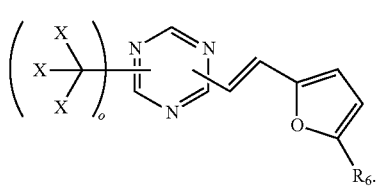

(8)

In another embodiment of any of the above aspects this invention, wherein said solid component b) is said trihalomethyl derivative, X is Cl.

In another embodiment of any of the above aspects this invention, wherein said solid component b) is said trihalomethyl derivative, X is Br.

In another embodiment of this invention, wherein said solid component b) is said trihalomethyl derivative, it may be a derivative having structure (9), wherein X is Cl or Br, and further wherein, R$_6$ is hydrogen or a C1 to C3 alkyl. In one aspect of this embodiment X is Cl, in another X is Br.

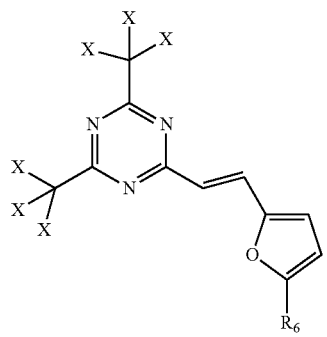

(9)

In another embodiment of this invention, wherein said solid component b) is a trihalomethyl derivative having above structure (8) or (9), where $R_6$ is hydrogen.

In another embodiment of this invention, wherein said solid component b) is a trihalomethyl derivative having above structure (8) or (9), where $R_6$ is methyl.

In another embodiment of this invention, wherein said solid component b) is a trihalomethyl derivative having above structure (8) or (9), where $R_6$ is ethyl.

In another embodiment of this invention, said solid component b) is a trihalomethyl derivative having structure (10).

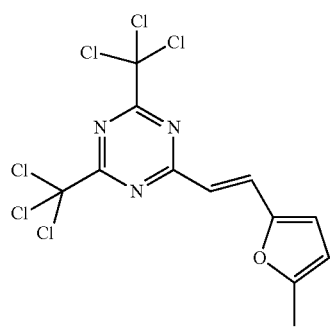

(10)

In another embodiment of any of the above aspects of this invention said solid component c), said crosslinking agent, comprises an etherified melamine where this etherified aminoplast crosslinking agent comprises an organic oligomer or polymer that provides a carbonium ion upon and serves to crosslink the film-forming binder resin in the presence of an acid generated by radiation, preferably imaging radiation. This renders the binder resin insoluble in an alkaline medium, in the exposed areas. Such crosslinking agents may be prepared from a variety of aminoplasts in combination with a compound or low molecular weight polymer containing a plurality of hydroxyl, carboxyl, amide or imide groups. Preferred amino oligomers or polymers are aminoplasts obtained by the reaction of an amine, such as urea, melamine, or glycolurea with an aldehyde, such as formaldehyde. Such suitable aminoplasts include urea-formaldehyde, melamine-formaldehyde, benzoguanamine-formaldehyde, and gylcoluril-formaldehyde resins, and combinations of any of these. A particularly preferred aminoplast is hexa(methoxymethyl) melamine oligomer.

In another embodiment of any of the above aspects of this invention said solid component c), said crosslinking agent, comprises etherified melamines selected from ones having structure (11), oligomers formed by (11) or mixtures of these; wherein $R_7$ is a C1 to C4 alkyl, H or represents a moiety of structure (11a), wherein ⁓ represents the attachment point of moiety (11a) to structure (11), wherein $R_{7a}$ is a C1 to C4 alkyl, H or represents another moiety of structure (11a).

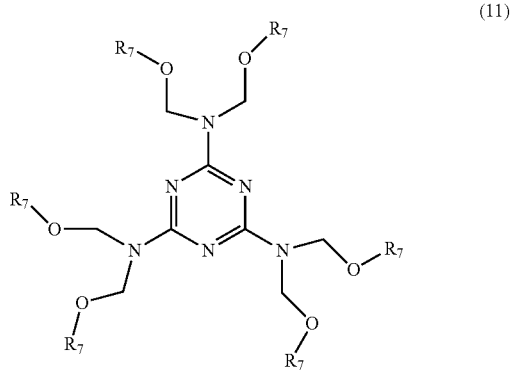

(11)

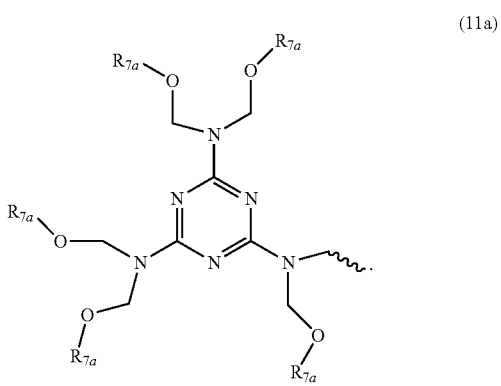

(11a)

In another embodiment of any of the above aspects of this invention said solid component c), said crosslinking agent, comprises etherified melamines selected from ones having structure (12), oligomers formed by (12) or mixtures of these; wherein $R_8$ is methyl, H or represents a moiety of structure (12a), wherein ⁓ represents the attachment point of moiety (12a) to structure (12), wherein $R_{8a}$ is methyl, H or represents another moiety of structure (12a).

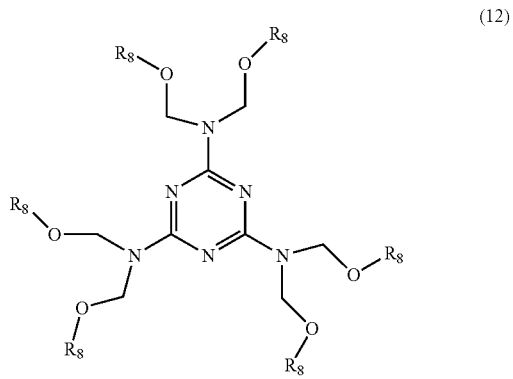

(12)

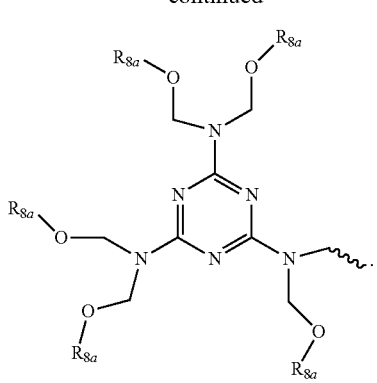

(12a)

In a particularly preferred embodiment of the present invention, said solid component d), said dye, having a molar attenuation coefficient at 365 nm ranging from about $1.74 \times 10^4$ to about $0.94 \times 10^4$ mole$^{-1}$ L cm$^{-1}$ as measured in PGMEA. This I-line sensitive dye (a.k.a. 365 nm) may include ones such as Sudan Orange G; Martins Yellow; Dye O-PM ester; 2,3',4,4'-tetramethylhydroxybenzophenone, 9-anthracene methanol; phenoxymethyl anthracene; 9,10-diphenylanthracene; substituted phenanthracenes and substituted biphenyls and the like.

In another embodiment of any of the above aspects of this invention said solid component d), said dye, is an aqueous base soluble dye having structure (13), wherein m1 and m2, independently, are 1 to 3, in another aspect of this embodiment m1 and m2 are both 2, in another aspect of this embodiment m1 is 1 and m2 is 3.

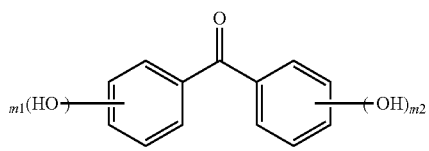

(13)

In another embodiment, in structure (13), m1 and m2 may range from 0 to 3, with the proviso that at least one of either m1 or m2 is not 0.

In another embodiment of this invention said solid component d), said dye, is an aqueous base soluble dye having structure (14).

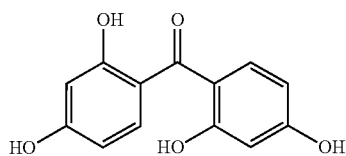

(14)

In another embodiment of any of the above aspects of this invention said solid component e), said quencher system, having a boiling point of at least 100° C. at 1 atmosphere pressure, consists only of a compound or a mixture of compounds having structure (1), is one wherein $R_1$ is a C15 to C20 alkyl moiety, and $R_{1a}$ is —(CH$_2$)$_n$OH, wherein n is an integer ranging from 2 to 4, and further wherein position 3 and 2 are connected by a single bond. In another aspect of this embodiment the quencher has a boiling point of at least 150° C., in another at least 200° C., in another at least 250° C. and in yet another embodiment at least 300° C.

In another embodiment of any of the above aspects of this invention said solid component e), said quencher system, having a boiling point of at least 100° C. at 1 atmosphere pressure, consists only of a compound or a mixture of compounds having structure (1), one having one compound of structure (1), wherein $R_{1a}$ is —(CH$_2$)$_n$OH, and wherein n is 2 or 3, and further wherein position 3 and 2 are connected by a single bond. In another aspect of this embodiment the quencher has a boiling point of at least 150° C., in another at least 200° C., in another at least 250° C. and in yet another embodiment at least 300° C.

In another embodiment of any of the above aspects of this invention said solid component e), said quencher system, having a boiling point of at least 100° C. at 1 atmosphere pressure, consists only of a compound or a mixture of compounds having structure (1), wherein $R_{1a}$ is —(CH$_2$)$_n$OH, and wherein n is 2, and further wherein position 3 and 2 are connected by a single bond. In another aspect of this embodiment the quencher has a boiling point of at least 150° C., in another at least 200° C., in another at least 250° C. and in yet another embodiment at least 300° C.

In another embodiment of any of the above aspects of this invention said solid component e), said quencher system, consists of a compound of structure (15).

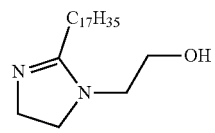

(15)

In another embodiment of this invention said solid component e), said quencher, having a boiling point of at least 100° C. at 1 atmosphere pressure, consists of only of a compound or a mixture of compounds having structure (1), is one wherein $R_1$ is a C15 to C20 alkyl moiety, and $R_{1a}$ is a C1 to C5 alkyl, and further wherein position 3 and 2 are connected by a single bond. In another aspect of this embodiment the quencher has a boiling point of at least 150° C., in another at least 200° C., in another at least 250° C. and in yet another embodiment at least 300° C.

In another embodiment of this invention said solid component e), said quencher consists of only of a compound or a mixture of compounds having structure (1), having a boiling point of at least 100° C. at 1 atmosphere pressure, is one wherein $R_1$ is a C15 to C20 alkyl moiety, and $R_{1a}$ is a C3 to C5 alkyl, and further wherein position 3 and 2 are connected by a single bond. In another aspect of this embodiment the quencher has a boiling point of at least 150° C., in another at least 200° C., in another at least 250° C. and in yet another embodiment at least 300° C.

In another embodiment of this invention said solid component e), said quencher, having a boiling point of at least 100° C. at 1 atmosphere pressure, consists of only of a compound or a mixture of compounds having structure (1), is one wherein $R_1$ is a C15 to C20 alkyl moiety, and $R_{1a}$ is a C4 to C5 alkyl, and further wherein position 3 and 2 are connected by a single bond. In another aspect of this embodiment the quencher has a boiling point of at least 150° C., in another at least 200° C., in another at least 250° C. and in yet another embodiment at least 300° C.

In another embodiment of any of the above aspects of this invention said solid component e), said quencher, having a boiling point of at least 100° C. at 1 atmosphere pressure, consists only of a compound or a mixture of compounds having structure (1), wherein $R_1$ is a C1 to C5 alkyl moiety, or H and $R_{1a}$ is —$(CH_2)_n$OH, wherein n is an integer ranging from 2 to 4, and further wherein position 3 and 2 are connected by a double bond. In another aspect of this embodiment the quencher has a boiling point of at least 150° C., in another at least 200° C., in another at least 250° C. and in yet another embodiment at least 300° C.

In another embodiment of any of the above aspects of this invention said solid component e), said quencher having a boiling point of at least 100° C. at 1 atmosphere pressure, consists of only of a compound or a mixture of compounds having structure (1), wherein $R_1$ is a C1 to C3 alkyl moiety, or H and $R_{1a}$ is —$(CH_2)_n$OH, wherein n is an integer ranging from 2 to 4, and further wherein position 3 and 2 are connected by a double bond. In another aspect of this embodiment the quencher has a boiling point of at least 150° C., in another at least 200° C., in another at least 250° C. and in yet another embodiment at least 300° C.

In another embodiment of any of the above aspects of this invention said solid component e), said quencher, having a boiling point of at least 100° C. at 1 atmosphere pressure, consists of only of a compound or a mixture of compounds having structure (1), wherein $R_1$ is H and $R_{1a}$ is —$(CH_2)_n$OH, wherein n is an integer ranging from 2 to 4, and further wherein position 3 and 2 are connected by a double bond. In another aspect of this embodiment the quencher has a boiling point of at least 150° C., in another at least 200° C., in another at least 250° C. and in yet another embodiment at least 300° C.

In another embodiment of any of the above aspects of this invention said solid component e), said quencher consists of only of a compound of structure (16).

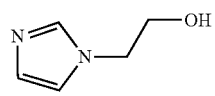
(16)

In another embodiment of the above aspects of this invention said solid component e), a quencher having a boiling point of at least 100° C. at 1 atmosphere pressure, is one having one compound of structure (1), wherein R1 is a C15 to C20 alkyl moiety, and $R_{1a}$ is a C3 to C5 alkyl, and further wherein position 3 and 2 are connected by a double bond. In another aspect of this embodiment the quencher has a boiling point of at least 150° C., in another at least 200° C., in another at least 250° C. and in yet another embodiment at least 300° C.

In another embodiment of the above aspects of this invention said solid component e), a quencher having a boiling point of at least 100° C. at 1 atmosphere pressure, is one having one compound of structure (1), wherein R1 is a C15 to C20 alkyl moiety, and $R_{1a}$ is a C4 to C5 alkyl, and further wherein position 3 and 2 are connected by a double bond. In another aspect of this embodiment the quencher has a boiling point of at least 150° C., in another at least 200° C., in another at least 250° C. and in yet another embodiment at least 300° C.

In another embodiment of any of the above aspects of this invention said solid component e), said quencher system consists only of a compound or a mixture of compounds, having a boiling point of at least 100° C. at 1 atmosphere pressure, having structure (17), wherein where n and n' are independently an integer ranging from 2 to 4 and R' is a C1-C4 alkyl or H. In another aspect of this embodiment the quencher has a boiling point of at least 150° C., in another at least 200° C., another at least, 250° C. and in yet another embodiment at least 300° C.

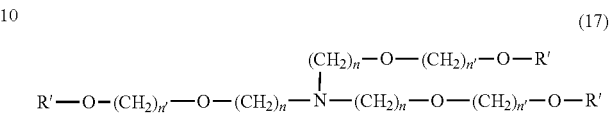
(17)

In another embodiment of any of the above aspects of this invention said solid component e), said quencher having a boiling point of at least 100° C. at 1 atmosphere pressure, consists of only of a compound or a mixture of compounds having structure (17), wherein where n and n' are 2 and R' is a C1-C4 alkyl or H. In another aspect of this embodiment the quencher has a boiling point of at least 150° C., in another at least 200° C., another at least, 250° C. and in yet another embodiment at least 300° C.

In another embodiment of any of the above aspects of this invention said solid component e), said quencher having a boiling point of at least 100° C. at 1 atmosphere pressure, system consists only of a compound or a mixture of compounds having structure (17), wherein where n and n' are 2 and R' is a C1-C4 alkyl or H. In another aspect of this embodiment the quencher has a boiling point of at least 150° C., in another at least 200° C., in another at least 250° C. and in yet another embodiment at least 300° C.

In another embodiment of any of the above aspects of this invention said solid component e), said quencher system consists only of a compound having structure (18).

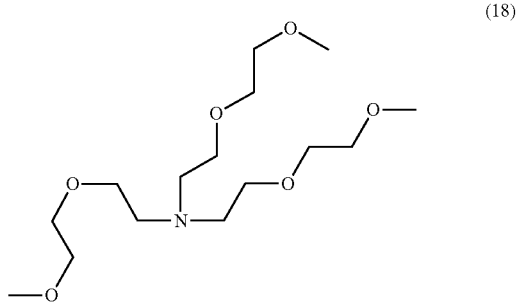
(18)

In another embodiment of any of the above aspects of this invention said solid component e), said quencher system consists only of a compound or a mixture of compounds, having a boiling point of at least 100° C. at 1 atmosphere pressure, having structure (19), wherein where n and n' are independently 2 to 4.

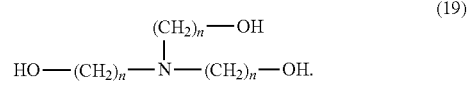
(19)

In another embodiment of any of the above aspects of this invention said solid component e), said quencher system consists only of a compound having structure (20).

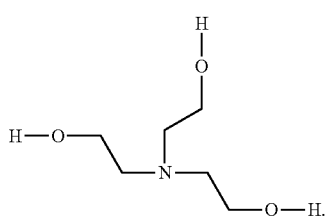

(20)

In another embodiment of any of the above aspects of this invention said solid component e), said quencher system consists only of a compound or a mixture of compounds, having a boiling point of at least 100° C. at 1 atmosphere pressure, having structure (21), wherein $R_9$ and $R_{10}$ are independently selected from H, or a C-2-C25 alkyl and further wherein at least one of R9 or R10 is a C2-C25 alkyl.

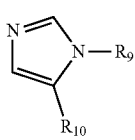

(21)

In another embodiment of any of the above aspects of this invention said solid component e), said quencher system consists only of a compound or a mixture of compounds, having a boiling point of at least 100° C. at 1 atmosphere pressure, having structure (22), wherein R10 is a C2-C25 alkyl.

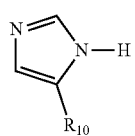

(22)

In another embodiment of the above aspects of this invention said solid component e), said quencher system, where the quencher has a boiling point of at least 100° C. at 1 atmosphere pressure, is one having one compound of structure (1), wherein $R_1$ is a C2 to C20 alkyl moiety, and $R_{1a}$ is a C1 to C5 alkyl, and further wherein position 3 and 2 are connected by a double bond.

In another embodiment of any of the above aspects of this invention said solid component e), said quencher system consists only of a compound having structure (23).

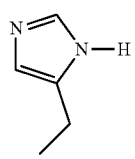

(23)

In the above described novel composition the solid components may be dissolved in a solvent component f) which is an organic solvent. Examples of suitable organic solvents include, without limitation, butyl acetate, amyl acetate, cyclohexyl acetate, 3-methoxybutyl acetate, methyl ethyl ketone, methyl amyl ketone, cyclohexanone, cyclopentanone, ethyl-3-ethoxy propanoate, methyl-3-ethoxy propanoate, methyl-3-methoxy propanoate, methyl acetoacetate, ethyl acetoacetate, diacetone alcohol, methyl pivalate, ethyl pivalate, propylene glycol monomethyl ether, propylene glycol monoethyl ether, propylene glycol monomethyl ether propanoate, propylene glycol monoethyl ether propanoate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, gamma-butyrolactone, propylene glycol methyl ether acetate, propylene glycol ethyl ether acetate, propylene glycol propyl ether acetate, methyl lactate, ethyl lactate, propyl lactate, tetramethylene sulfone, propylene glycol dimethyl ether, dipropylene glycol dimethyl ether, ethylene glycol dimethyl ether or diethylene glycol dimethyl ether, gamma butyrolactone. These solvents may be used singly or in a mixture of two or more.

In one embodiment, the solid components are dissolved in PGMEA (1-Methoxy-2-propanyl acetate).

Other optional additives, which have compatibility with and can be added to the novel photoresist composition disclosed and claimed herein according to need, include auxiliary resins, plasticizers, surface leveling agents and stabilizers to improve the properties of the resist layer, and the like. Surface leveling agents may include surfactants. There is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.).

In all embodiments described above for the composition of the photoresist invention, the total solid components in the solvent component f) comprises from about 30 to about 45 wt % total solids in the solvent.

In all embodiments described above for the composition of the photoresist invention, the composition of the solid components in terms of wt % of total solids may be one, wherein solid component a) is about 60 to about 90 wt %; solid component b) is about 0.5 to about 8.0 wt %; solid component c) is about 8.0 to about 30 wt %; solid component d) is about 0.4 to about 8.0 wt %; and solid component e) is about 0.5 to about 4.0 wt %. In another aspect of this embodiment solid component a) may be about 65 to about 85 wt %, or about 70 to about 80 wt %. In another aspect of this embodiment solid component b) may be about 1 to about 7 wt % or about 2 to about 6 wt % or about 3 to about 5 wt %. In another aspect of this embodiment solid component c) may be about 10 to about 25 wt % or about 12 to about 20 wt %, or about 13 to about 20 wt %. In another aspect of this embodiment solid component d) may be about 1 to about 7 wt %, or about 1 to about 6 wt %, or about 1 to about 4 wt %, or about 2 to about 3.5 wt %. In another aspect of this embodiment solid component e) may be about 1 to about 6 wt %, or about 1 to about 4 wt %, or about 1 to about 3 wt % or about 1 to about 2 wt %. In all these aspects of the composition the total wt % sum, of all the solid components a), b), c), d) and e), does not exceed 100 wt %, and is equal to 100 wt % if no optional components as described above are additionally present (e.g. surfactants).

The procedure for the preparation of a patterned photoresist layer by using the photosensitive composition, disclosed herein, can be conventional. For example, a substrate such as a semiconductor silicon wafer or an LED substrate is evenly coated with the novel photoresist composition in the form of a solution by using a suitable coating machine such as a spin-coater followed by baking in a convection oven or on a hotplate to form a photoresist layer which is then exposed pattern-wise to actinic radiation such as near ultraviolet light, or visible light emitted from low-pressure, high-pressure and ultra-high-pressure mercury lamps, arc lamps and the like through a photomask. The actinic radiation must contain some significant component at about 365 nm, so as to minimize the exposure time needed Thereafter, the latent image in the photoresist layer may optionally be baked in a convection oven or on a hotplate, developed using an alkaline developer solution such as an aqueous solution of tetra (C1-C4 alkyl)ammonium hydroxide, choline hydroxide, lithium hydroxide, sodium hydroxide, or potassium hydroxide, for example, tetramethyl ammonium hydroxide, in a concentration of 1 to 10% w/w, to yield a patterned photoresist layer having good fidelity to the pattern of the photomask.

Specifically, another aspect of this invention is a process for imaging a the above described novel photoresist composition may comprise the following steps:
  a1) coating any one of the above described photoresist composition onto the surface of a suitable substrate forming a photoresist coating;
  b1) heat treating said photoresist coating from step a1) until substantially all of the photoresist solvent is removed from the photoresist composition, forming a photoresist film;
  c1) imagewise exposing said photoresist film from step b1) to imaging i-line radiation to forming an irradiated photoresist film containing exposed and non-exposed regions;
  d1) baking said irradiated photoresist film after the exposing step of c1);
  e1) removing the unexposed areas of said irradiated photoresist film from step d1) with a developer, forming a substrate covered with undercut photoresist patterns which are undercut at the resist substrate interphase forming a photoresist overhang.

Another inventive process is a lift-off process for metallization of a patterned photoresist on a substrate which may comprise the following steps:
  a2) depositing a layer of metal over said substrate covered with undercut photoresist patterns from step e1) of the above described process for imaging the novel photoresist, using metal deposition by EBPVD, CVD deposition or sputtering, wherein metal deposition over said substrate which is covered with undercut photoresist patterns. In this step metal only deposits in uncovered substrate is said photoresist pattern which are not protected by either the photoresist film itself, or by the overhang of resist at said substrate interphase. In this manner, metal deposition occurs elsewhere on the substrate not covered by remaining photoresist, or the resist overhang, forming a substrate with has selective metal deposition, and a undercut photoresist pattern which is has a coating of metal only at the top of the photoresist pattern only (surface metalized resist pattern) but not in the uncovered substrate in said patterned photoresist protected by the overhang.
  b2) after step a2) a stripping process is employed to remove said metalized photoresist pattern, resulting in a substrate, wherein metallization has occurred only in the uncovered substrate in said patterned photoresist that is not protected by the overhang of the undercut patterned photoresist. In this step, the stripping process may be accomplished by either using a chemical stripper, or by using an adhesive tape. If the stripping is done using an adhesive tape, a further chemical stripping step may be required to remove any residual photoresist.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Materials

CKS-670: is a commercially available Novolak polymer from Shonol (Japan) ($M_w$: 9034, $M_n$: 2195 PD: 4.1), which was employed in resist formulations, is a copolymer of Bisphenol A, meta-cresol and formaldehyde it comprises repeat unit having the general structure (2) wherein q represents the number of repeat units in the polymer chain and attachment of the —$CH_2$— repeat unit may be at ortho or para positions. The binder resin may also contain branched structures in which an additional 1 to 2 ortho-positions on the repeat unit derived from Bisphenol A are linked to a —$CH_2$— repeat unit attached to another repeat unit derive from either meta-cresol or Bisphenol A. Further, an additional meta or para position on the repeat unit derived from meta-cresol can be linked to a —$CH_2$— repeat unit attached to another repeat unit derived from either meta-cresol or Bisphenol A.

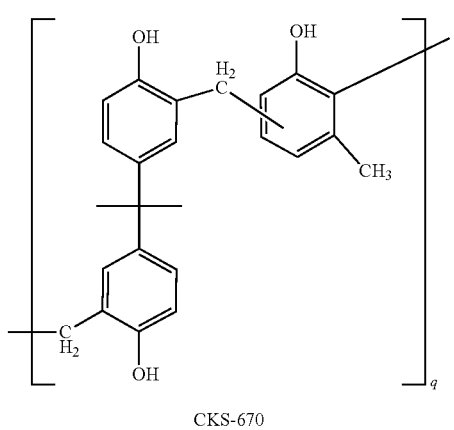

CKS-670

Cymel 301 and Cymel 300 are commercially available etherified melamine commercially available from Alnex Norge KS, Norway and are comprised of methylated melamines derived from the following monomer structure and comprise oligomers of the monomer having the following structure, but which is also described, in more detail, in above structure (12):

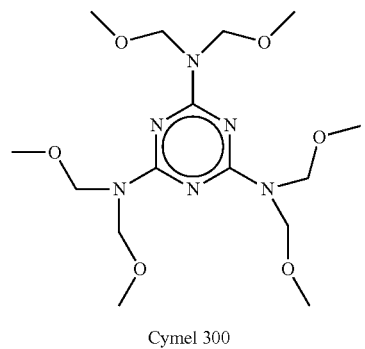

Cymel 300

TME-triazine is a commercially available photoacid generator by Sanwa Chemical Co. LTD, Tokyo (Japan), and has the following structure:

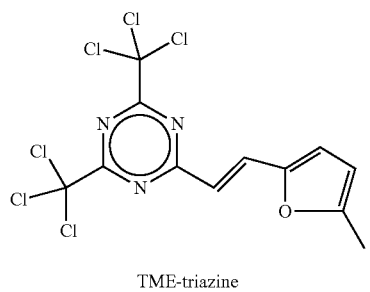

TME-triazine

PIW-501 is a commercially available photoacid generator ((Z)-4-methoxy-N-(tosyloxy)benzimidoyl cyanide), sold under the commercial name PA-528 by Heraeus (Hanau, Germany), and has the following structure:

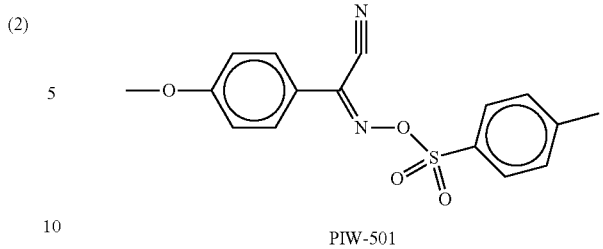

PIW-501

DI-dye is a commercially available dye (bis(2,4-dihydroxyphenyl)methanone) from DSP Gokyo Food & Chemicals (Japan), it has a molar attenuation coefficient of $1.34 \times 10^4$ mole$^{-1}$ L cm$^{-1}$, as measured in PGMEA, and has the following structure:

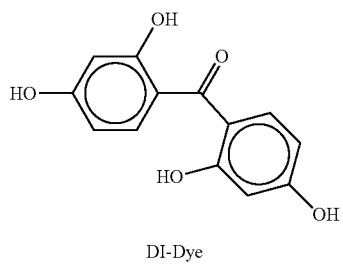

DI-Dye

Coumarin 7 dye is commercially available dye, it has a molar attenuation coefficient of 900.28 mole$^{-1}$ L cm$^{-1}$ and is sold by Sigma-Aldrich a subsidiary of Merck KGaA (Darmstadt, Germany); and it has the following structure:

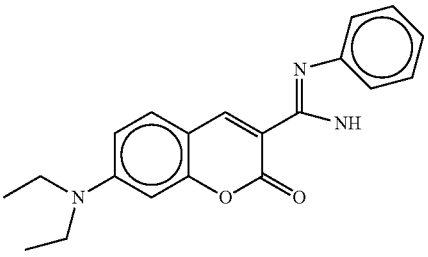

Coumarin 7 Dye

Addi-MC (Mona-C) is an amine quencher (2-(2-heptadecyl-4,5-dihydro-1H-imidazol-1-yl)ethan-1-ol), sold under the commercial name "Monazoline-C," by Croda International plc (Snaith, UK); it has a boiling point at 1 atmosphere of ~489° C. and a pKa in water of ~10.08, and has the following structure:

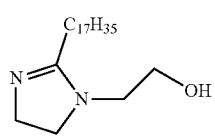

Addi MC (Monazoline C)

IA is an amine quencher (1-(2-hydroxyethylimidazole) sold by Sigma-Aldrich a subsidiary of Merck KGaA (Darmstadt, Germany); it has a boiling at 1 atmosphere of ~316.5° C. and a pKa in water of ~6.78 and has the following structure:

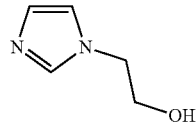

IA

DIPA is an amine quencher (2,6-diisopropylaniline) sold by Sigma-Aldrich a subsidiary of Merck KGaA (Darmstadt, Germany); it has a boiling point at 1 atmosphere of ~257° C. and a pKa in water of ~4.25, and has the following structure:

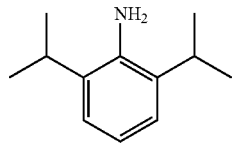

DIPA = Diisopropyaniline

DPA is an amine quencher (triphenylamine) sold by Sigma-Aldrich a subsidiary of Merck KGaA (Darmstadt, Germany); it has a boiling point of ~365° C. and a pKa in water of ~−3.04, and has the following structure:

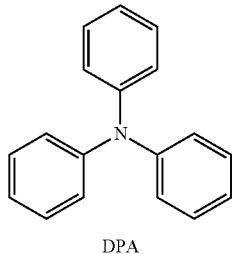 [SMILES: c1ccc(N(c2ccccc2)c2ccccc2)cc1]

DPA

MNNE is an amine quencher, 2-(2-methoxyethoxy)-N,N-bis[2-(2-methoxyethoxy)ethyl]-Ethanamine, (CAS 70384-51-9) (also called Tris[2-(2-methoxyethoxy)-ethyl]amine) sold by Sigma-Aldrich a subsidiary of Merck KGaA (Darmstadt, Germany); it has a boiling point at 1 atmosphere of ~257° C. and a pKa in water of ~6.92, and has the following structure:

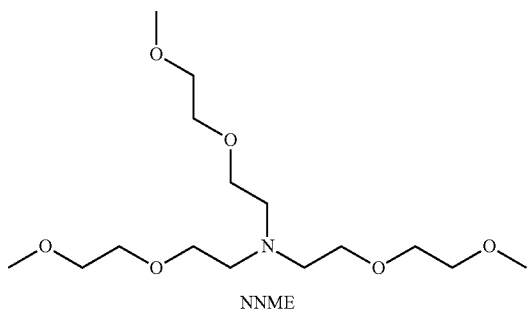

NNME

2EI is an amine quencher, 2-Ethylimidazole by Sigma-Aldrich a subsidiary of Merck KGaA (Darmstadt, Germany); it has a boiling point at 1 atmosphere of ~268° C. and a pKa in water of ~8.22, and has the following structure:

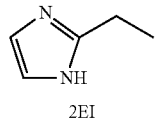

2EI

PGMEA (1-Methoxy-2-propanyl acetate), the solvent used for photoresist formulation examples was obtained from Sigma-Aldrich a subsidiary of Merck KGaA (Darmstadt, Germany).

APS-43 is a surfactant: from Shinetsu, (Tokyo, Japan).

R-2011 is a surfactant: from DIC Corp (Dusseldorf, Germany).

AZ 300MIF developer was obtained from EMD Performance Materials Corp, a subsidiary of Merck KGaA (Darmstadt, Germany) (a.k.a. 2.38% Tetramethylammonium hydroxide(TMAH)).

Photoresist Preparation and Processing

The components of the Examples described in Tables 1, 2, 3, 4 and 5 were combined together in the proportion as described in these Tables by dissolved them in PGMEA, followed by a filtration through a 0.2 micron PTFE (polytetrafluoroethylene) filter. The sample size, for a typical resist formulation tested, these contained from about 50 mL to about 100 mL of PGMEA.

An ASML i-line wafer stepper PAS 5500, was used to exposed the resist films of the examples provided at 0.48 numerical aperture. The Nikon FX-6010 stepper was also used in one example as described. The photoresist is then subjected to a post exposure second baking or heat treatment, before development. The temperature and time of baking is optimized to give the appropriate amount of crosslinking in the photoresist film and is disclosed in the FIG's corresponding to the examples. Optitrack ovens were also used for the post exposure bake process.

The exposed negative-acting photoresist-coated substrates are developed to remove the unexposed areas, normally by immersion, puddle or spray development with an alkaline developing solution. The resist coatings of the examples were puddle developed using AZ® 300MIF developer, which is a standard aqueous tetramethylammonium solution. The substrates are allowed to remain in the developer until all, or substantially all, of the photoresist coating has dissolved from the unexposed areas. The wafers were then rinsed thoroughly with DI water.

The resist pattern profile cross sections were examined by means of scanning electron microscopy. A Hitachi S-4700 or Hitatchi SU8030 SEM were used.

Superior Results using the Combined DI-Dye and Monazoline C:

Table 1 (FIG. 11), apart from describing the composition of the novel photoresist compositions, and comparative photoresist compositions, also summarizes undercut performance by showing representative SEM cross-section pictures which are characteristic of the undercut behavior observed for each of these formulations. Specifically, Table 1 compares 8 resist formulations, some of which contain all the components needed to manifest the unexpected large undercut SEM features with large exposure latitude.

The presence of both the specific quencher amine and specific dye specified in our inventive composition appear to be crucial for this unexpected result to manifest itself. Table 1 also shows the results for comparative formulation which do not manifest this unexpected result because they are either missing one the essential components, or contain, in addition to the essential amine quencher, another amine quencher having too low pKa and/or boiling point (e.g.). Although the addition of more than one amine quencher is possible, this additional amine quencher must share with the primary essential amine quencher the properties of a pKa in water from about 6.0 to about 12, and the amine quencher has also have a boiling point of at least 100° C. (1 atmosphere) and must be substituted with a C10-C25 alkyl substituent, a —$(CH_2)_n$OH substituent (n=2-4), or a mixture of these two substituents.Although, not bound by theory, it is possible that amines having lower pKa and low boiling points allow for more diffusive behavior of either the photoacid generate by the PAG, which, somehow, is deleterious to getting good undercut profiles. Also, not bound by theory the role of the dye may be to limit penetration of 365 nm light deeper into the film, affecting the acid gradient in the film, which may also be contributing to the undercut performance. This said, our unexpected result may arise from more complex factors, such as the distribution of the components themselves in the resist film prior to, and also after exposure and/or bake during resist processing.

The Formulations which contained the combination of Monazoline C (addi MC) and DI-dye, Examples 1, 2 and 3, produced the desired profiles, distinguished by extended undercut with a very large exposure latitude for the undercut.

Comparative Example 1, contained both the dye and Monazoline-C quencher, but which also contained an additional quencher (DIPA) which has a much lower pKa. This formulation does not show the pronounced under the undercut profile. Without being bound by theory, this behavior is believed to be attributed to the presence of a second quencher (DIPA) in the formulation.

Comparative Examples 2 and 3, contained the dye and a quencher DIPA; these formulations upon imaging again only produced sloped sidewall profiles without the extended undercut at the resist substrate interphase. Without being bound by theory this behavior is believed to be attributed to DIPA having a lower pKa.

Comparative Example 4 containing Monazoline C, but not the dye. This formulation exhibited some undercut profiles, albeit to a much lesser degree, only at low doses, and showed no exposure latitude Similarly, Comparative example 5, which also only contained Monazoline-C, but not the dye, did not produce an undercut profile. Thus, although the use on Monazoline-C without the dye did in some instances produce undercut profiles, these profiles if present consistently are of a much-reduced extent, and have if present only a narrow exposure margin at low exposure doses.

In summary, and as seen specifically in Table 1, all the formulations containing both Monanzoline-C and the dye (Examples 1 to 3) gave a much larger degree of undercut, as measure in microns, and also show undercuts which are very sharp and close the photoresist/substrate interface. These results are illustrated by the comparative SEM cross-section pictures in this Table and the row summarizing the extent of the undercut observed at the resist substrate interphase in microns.

FIG's 2 to 5 illustrates through SEM cross-section, in more detail, the undercut extent, and exposure margin of some of these formulations and other Examples of the novel photoresist compositions and comparative examples illustrating the unexpected advantage of these novel compositions over other comparative photoresist compositions, which imparts to the novel composition a greater degree of undercut coupled with a good exposure latitude for the extent of this undercut through dose.

Figure 3:
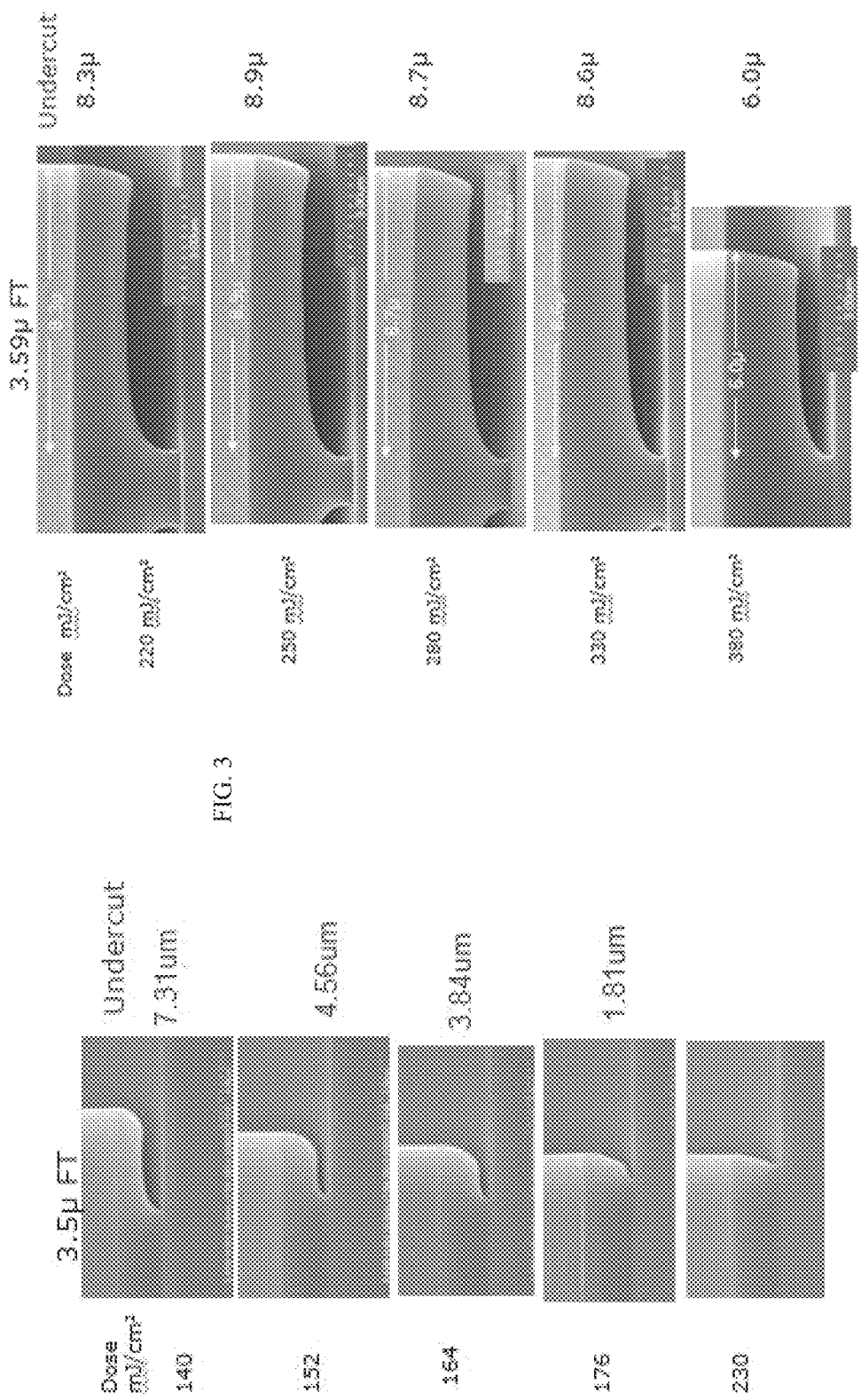
FIG. 3 Compares the undercut lithographic performance when using a photoresist formulation containing Monazoline C but without a DI-dye compared to a formation containing both Monazoline C and the DI-dye FIG. 4 Compares the undercut lithographic performance when using a photoresist formulation containing a DI-dye, but without Monazoline C compared to a formation containing both Monazoline C and the DI-dye FIG. 5 Compares the undercut lithographic performance of two photoresist formulations both containing Monazoline C and DI-dye but where one contains an Mine PAG which generates HCl and the second photoresist contains instead an i-line PAG which generates a sulfonic acid.

FIG. 3 Compares SEM cross-sections of extended undercut profile obtained using Comparative Example 6 which contains Monazoline C without the DI-dye and formulation (Example 3) which contains both Monazoline C and DI-dye. This shows that the formulation containing both Monazoline-C and DI-dye gives good undercut profiles through a wide range of doses compared Comparative Example 6a which contains Monazoline-C without the dye. Table 2 shows the composition of Comparative Example 6a.

The condition of exposure employed in FIG. 3 were as follows:

Comparative Example 6: condition of exposure soft bake (SB): 110° C./90"Exposure: Nikon FX-601 0.1NA stepper Post Exposure Bake (PEB): 105° C./2 min Development: 2.38% Tetramethylammonium hydroxide (TMAH)/60"

Example 3 condition of exposure: SB: 100° C./120 seconds PEB: 90° C./90 seconds Exposure: 0.48 NA, ASML i-line stepper Development: 40 seconds, AZ® 300MIF developer.

TABLE 2

| Composition of Comparative Example 6a | |
|---|---|
| Component | wt % |
| CKS-670 | 75.95 |
| Cymel 301 | 20.68 |
| TME-triazine | 1.65 |
| Addi-MC (Mona-C) | 1.39 |
| R-2011 | 0.58 |

Figure 4:
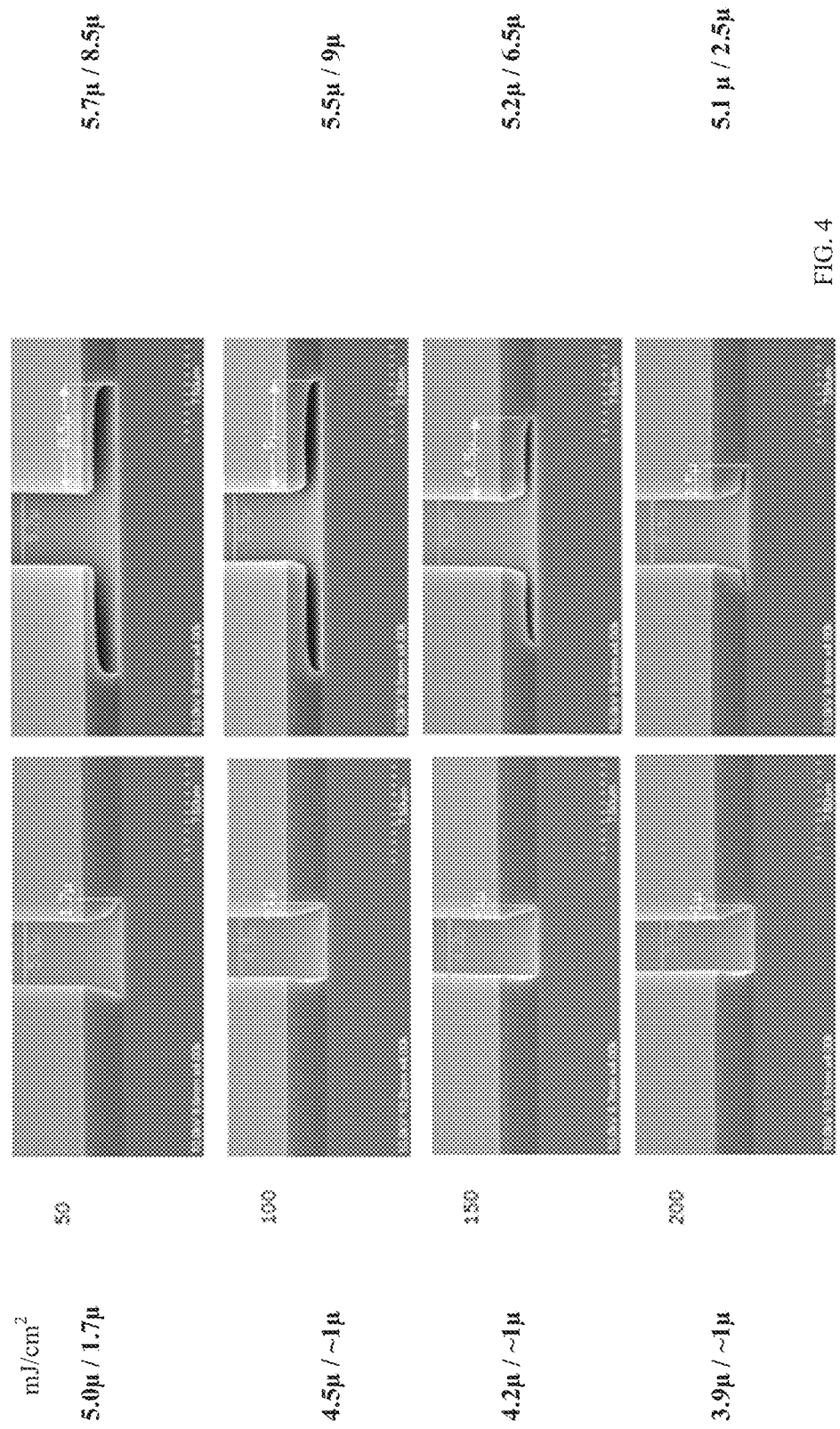

FIG. 4 Compares SEM cross-sections of extended undercut profile obtained using the formulation of Example 4, which contains both Monazoline C and DI-dye to the profile obtained with the formulation of comparative Example 7, that does not contain Monazoline C although it contains DI-dye. It is observed that the formulation that does not contain the Monazoline C, gives much inferior undercut performance as measure by the extent of exposure latitude through exposure dose.

Table 3 shows the composition of Comparative Example 7, and Example 4.

The condition of exposure employed in FIG. 4 were as follows: SB: 120° C./120" PEB 100° C./90"; Exposure: 0.48 NA, ASML i-line stepper Development: 60 seconds, AZ® 300MIF developer.

TABLE 3

| Composition of Comparative Example 7, and Example 4. | | |
|---|---|---|
| Components Wt % | Comparative Example 7 | Example 4 |
| CKS-670 | 83.136 | 75.915 |
| Cymel 301 | 16.388 | 14.95 |
| TME-triazine | 6.479 | 5.9 |
| DI-Dye | 2.23 | 2.035 |
| R-2011 | 0.058 | 0.05 |
| Addi-MC | . . . | 1.1 |
| % solids | 36.322 | 33.95 |

Figure 5:
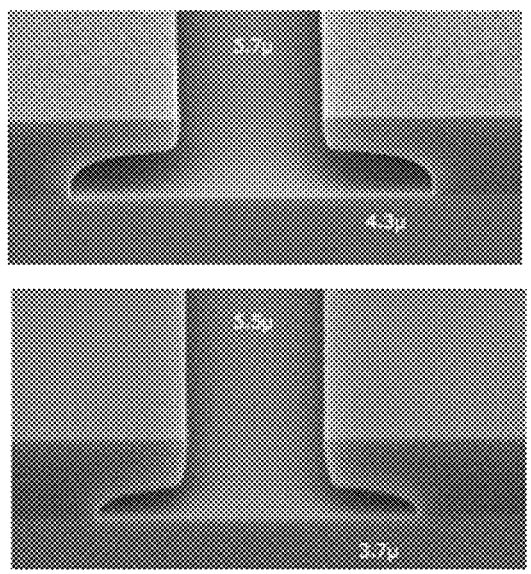
Figure 5:
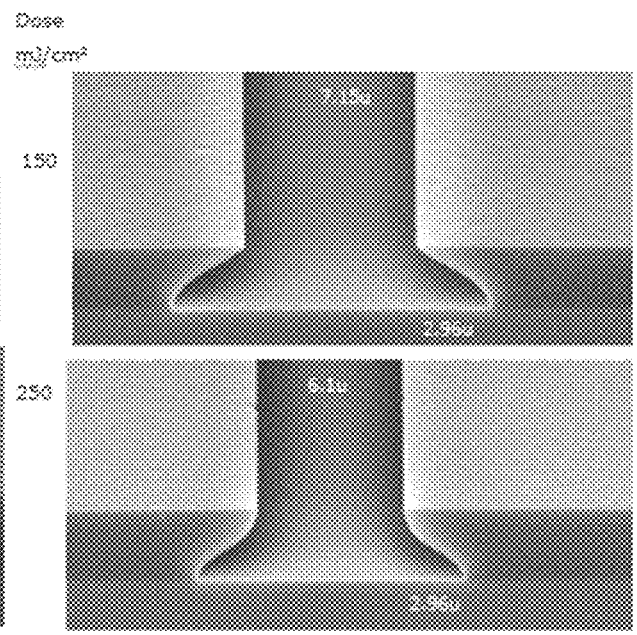

FIG. 5: Compares a SEM cross-section for extended undercut profile obtained using a formulation (Example 5)

containing the Monazoline C (Addi-MC), the DI-Dye, and an HCl generating PAG (TME-triazine) to the SEM undercut profile obtained using a formulation (Example 6) Monazoline C (Addi-MC), DI-Dye, and a sulfonic acid generating PAG (PIW-501) instead of an HCl generating PAG. It is observed that, while both formulation give undercut profiles, the formulation with the HCl generating PAG (TME-Triazine) the profiles obtained with the HCl generating PAG are somewhat better than those obtained with the sulfonic acid generating PAG.

Table 4 shows the composition of Example 5 and 6.

TABLE 4

Composition of Example 5, and Example 6.

| Components wt % | Example 5 | Example 6 |
|---|---|---|
| CKS-670 | 77.42 | 75.65 |
| Cymel 301 | 15.03 | 15.16 |
| TME-triazine | 4 | — |
| PIW-501 | — | 5.65 |
| DI-Dye | 2.02 | 2.38 |
| APS 437 | 0.03 | 0.15 |
| Addi-MC | 1.5 | 1.01 |
| % solids | 36.002 | 36.12 |

A formulation (Example 7) containing the amine quencher AI (1-H-Imidazole-1-ethanol) replacing Monazoline-C was also prepared (Table 5). An SEM cross-section study (FIG. 7) produced in a manner analogues that that described in FIG. 3 with Example 7, also gave similarly undercut profiles, as previously observed for Example 1 with a similar exposure latitude for the extent of the undercut, through exposure dose.

TABLE 5

Composition of Example 7.

| Components wt % | Example 7 |
|---|---|
| CKS-670 | 75.27 |
| Cymel 301 | 15.54 |
| TME-triazine | 5.61 |
| DI-Dye | 2.0 |
| AI | 1.5 |
| APS-437 | 0.08 |
| % solids | 31.37 |

Two other formulations Examples 8, and 9 containing, respectively, the amine quenchers MNNE [(2-(2-methoxyethoxy)-N,N-bis[2-(2-methoxyethoxy)ethyl]-Ethanamine) also called (Tris[2-(2-methoxyethoxy)-ethyl]amine)], or the amine quencher, 2EI (2-Ethylimidazole), were prepared, in which these amine quenchers replaced Monazoline-C, which were otherwise formulated analogously to Example 1. (Table 6). SEM cross-section studies of Example 8 (FIG. 6) and Example 9 (FIG. 7), produced, in a manner analogues, as was described in FIG. 3, gave similarly undercut profiles as were observed for Example 1, with a similar exposure latitude for the extent of the undercut, through exposure dose. Specifically, the processing conditions for these SEM studies were as follows exposure: SB: 120° C./120 seconds PEB: 100° C./90 seconds Exposure: 0.48 NA, ASML i-line stepper Development: 60 seconds, AZ® 300MIF developer. Thus, these SEM studies confirmed that MNNE, and 2EI both have a similar very good undercut and very good exposure latitude for this undercut as was observed for a formulation containing Addi-MC lithographically processed in the same manner Examples 8 and 9, containing amine quenchers MNNE and 2EI, commonly share with the formulations with amine quenchers, IA and Addi-MC, the constraints for amine quenchers previously discussed in the in detailed description of the invention where unexpectedly good undercut and exposure latitude for the undercut are achieved.

Namely,the quencher system constraint was that it must consist essentially of an amine quencher, or a mixture of such amine quenchers, having a pKa in water from about 6.0 to about 12, where the amine quencher has a boiling point of at least 100° C., at 1 atmosphere pressure, and comprises at least one C2-C25 alkyl substituent, a —$(CH_2)_n$OH substituent, or a —$(CH_2)_n$—O—$(CH_2)_{n'}$—O—R' substituent or comprises a mixture of these substituents.

An additional comparative example using TPA (Comparative Example 8), was prepared, were the amine quencher in the formulation was not within constraints defined for the amine quencher system of this inventive composition. Table 6 shows the composition of this formulation. This formulation was prepared and exposed in the same manner as described above for Example 8 and 9. Under these conditions, a SEM study (FIG. 7) showed that no undercut was observed. This is similar to what was observed with the formulations containing DIPA (Comparative Examples 2 and 3) which showed very poor undercut performance, and also shared the characteristic of containing an amine quencher in the formulation that was not within constraints defined for the amine quencher system of this inventive composition. Without being bound by theory this behavior is believed to be attributed to TPA having a lower pKa. The pKa of TPA is (−3.04) and that of DIPA is (4.25) while the pKa of the quenchers of the other examples, providing strong undercut profiles, range is around 6.92 to 10.98 shown in Table 9.

TABLE 6

Composition of Examples 8, 9 and Comparative Example 8.

| Components wt % | Example 8 | Example 9 | Comparative Example 8 |
|---|---|---|---|
| CKS-670 | 73.38 | 75.2 | 74.91 |
| Cymel 301 | 15.14 | 15.6 | 15.59 |
| TME-triazine | 5.48 | 5.61 | 5.59 |
| MNNE | 3.98 | | |
| 2EI | | 1.51 | |
| TPA | | | 1.97 |
| DI-Dye | 1.94 | 2.0 | 1.98 |
| APS 437 | 0.08 | 0.08 | 0.08 |
| % solids | 36.74 | 36.142 | 36.26 |

Figure 6:
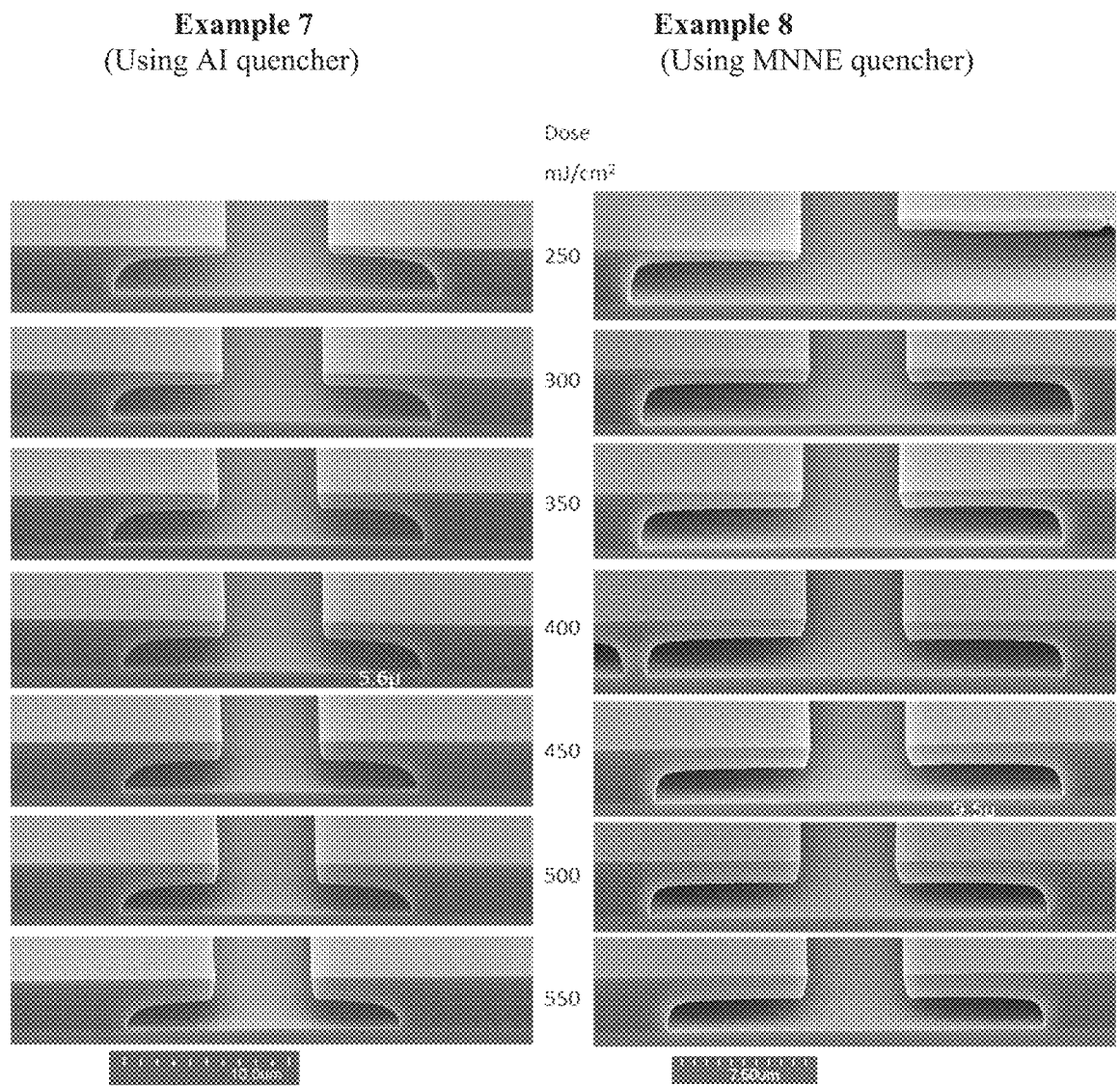
FIG. 6 Compares the undercut lithographic performance of two photoresist formulations Example 7 Using AI quencher and Example 8 Using MNNE quencher.

FIG. 6 Compares the undercut lithographic performance of two photoresist formulations Example 7 which was formulated with AI quencher and Example 8 which was formulated with MNNE quencher.

Figure 7:
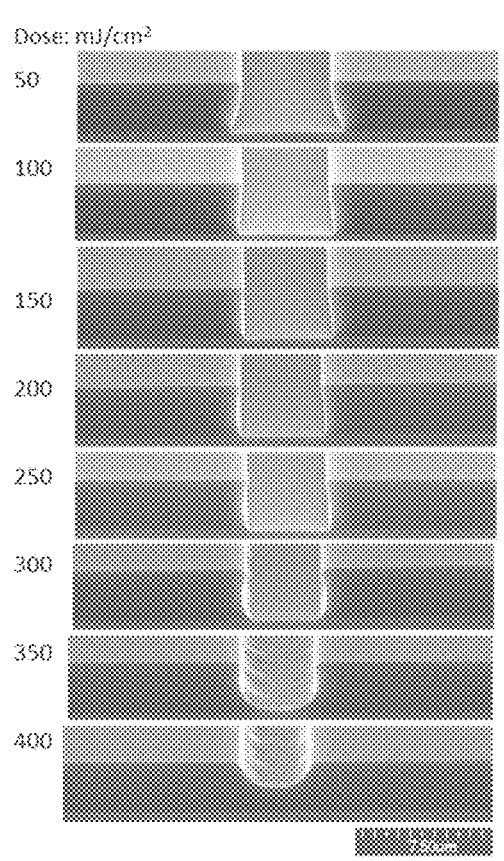
FIG. 7 Compares the undercut lithographic performance of two photoresist formulations Comparative Example 8 using TPA quencher and Example 9 using 2E1 quencher.
Figure 7:
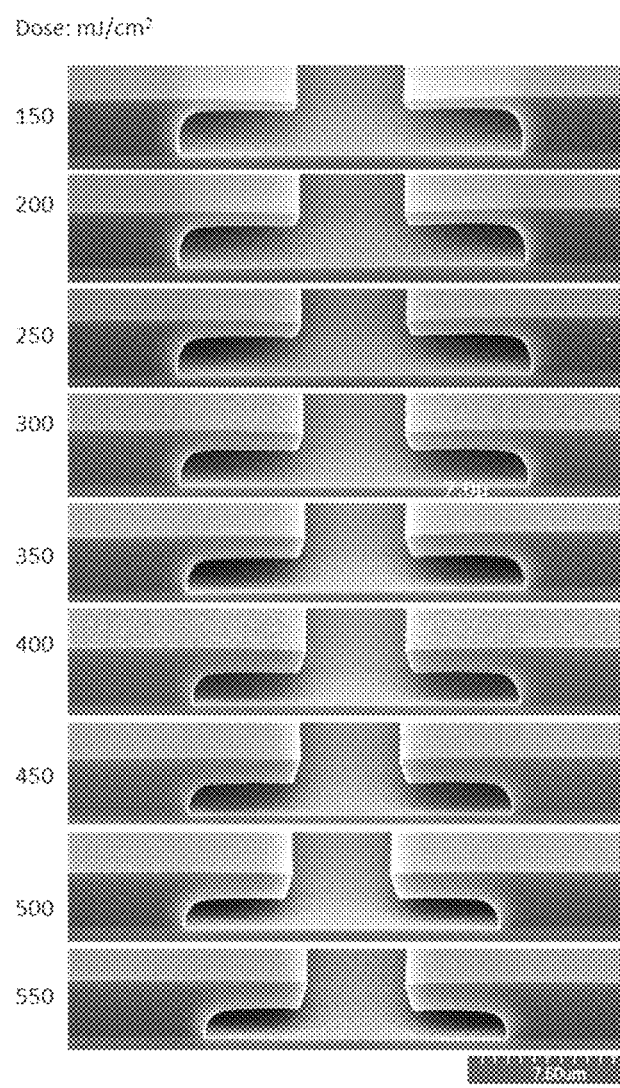

FIG. 7 Compares the undercut lithographic performance of two photoresist formulations Comparative Example 8 formulated with TPA quencher and Example 9 formulated with 2EI quencher.

The more pronounced undercuts at the resist substrate observed at the resist substrate interface coupled with a much greater exposure latitude for these undercuts, in the above described Examples of the inventive compositions, are unexpected characteristics which are highly desirable in a photoresist designed for lift-off application, employed in metallization protocols used in both the manufacture of traditional IC (integrated circuit) semiconductor devices and in the manufacture of LED devices.

TABLE 7

Composition of Examples 10, 11, 12 and 13

| Components wt % | Example 10 | Example 11 | Example 12 | Example 13 |
|---|---|---|---|---|
| CKS-670 | 73.86 | 75.32 | 75.2 | 70.46 |
| Cymel 301 | 15.25 | 15.56 | 15.53 | 14.55 |
| TME-triazine | 5.51 | 5.62 | 5.61 | 5.26 |
| N-Methyldipropylamine | 3.35 | | | |
| N,N-diisopropylethylamine | | 1.44 | | |
| Tris-isobutylamine | | | 1.59 | 7.8 |
| DI-Dye | 1.95 | 1.99 | 1.99 | 0.08 |
| APS 437 | 0.08 | 0.07 | 0.08 | 70.46 |

Formulations of Examples 10 and 11, in table 7 are prepared with N-Methyldipropylamine and with N,N-diisopropylethylamine quencher, respectively. Both formulations produced extended undercut profiles shown in FIG. 8. Similarly, Tris-isobutylamine quencher produced extended undercut profiles as shown in Example 13. However lower concentration of this quencher, in Example 12, produces a moderate degree of resist profile undercut, as shown in FIG. 9.

Figure 10:
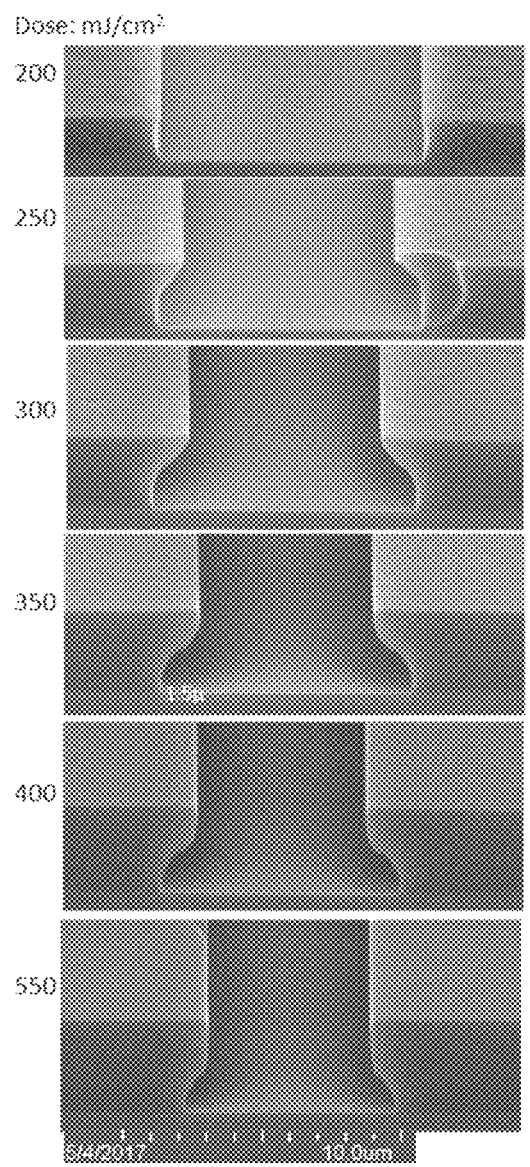
FIG. 10 Compares the undercut profiles of two photoresist formulations of Examples 14 and 15, using different dyes, Coumarin 7 dye and DI dye respectively.
Figure 10:
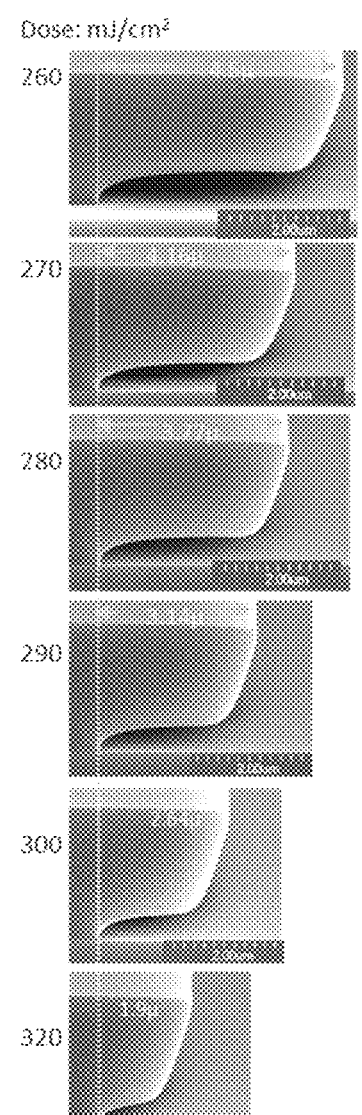

Formulations of Examples 14 and 15, in Table 8, were prepared with Coumarin 7 dye and DI dye, respectively. Formulation of Example 15 produced an extended undercut profile, while formulation of Example 14 produced a much more moderate undercut profile as shown in FIG. 10. This is partly attributed to the solubility of DI dye in the developer, and partly to the higher absorption of DI dye than Coumarin 7 dye. The Extinction coefficient of DI dye at 365 nm is $=1.34 \times 10$ mole$^-$ L cm$^{-1}$ and the Extinction coefficient of Coumarin 7 dye at 365 nm is $=0.090028 \times 10^4$ mole$^1$ L cm$^1$.

TABLE 8

Examples 14 and 15

| Components Wt % | Example 14 | Example 15 |
|---|---|---|
| CKS-670 | 76.33 | 77.42 |
| Cymel 301 | 15.639 | 15.03 |
| TME-triazine | 4.0 | 4.0 |
| DI-Dye | | 2.02 |
| Coumarin 7 | 2.241 | |
| Addi-MC | 1.547 | 1.5 |
| APS-437 | 0.252 | 0.03 |

Figure 8:
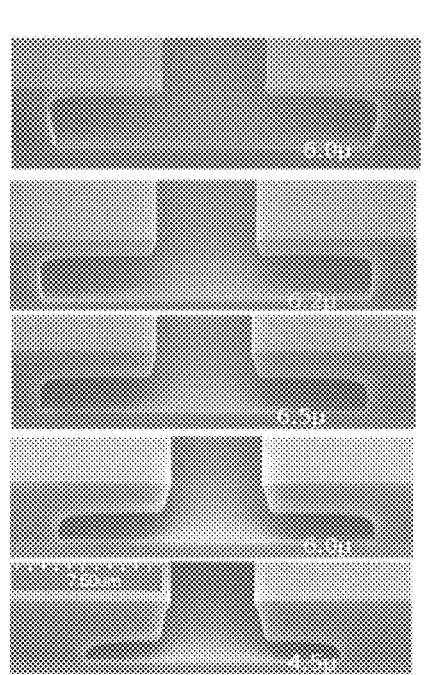
FIG. 8 Shows extended undercut lithographic performance of two photoresist formulations of Examples 10, using N-Methyldipropylamine quencher and Example 11, using N,N-diisopropylethylamine quencher respectively FIG. 9 Shows the undercut lithographic performance of two photoresist formulations using Tris-isobutylamine quencher at two different concentrations of Examples 12 and 13.
Figure 8:
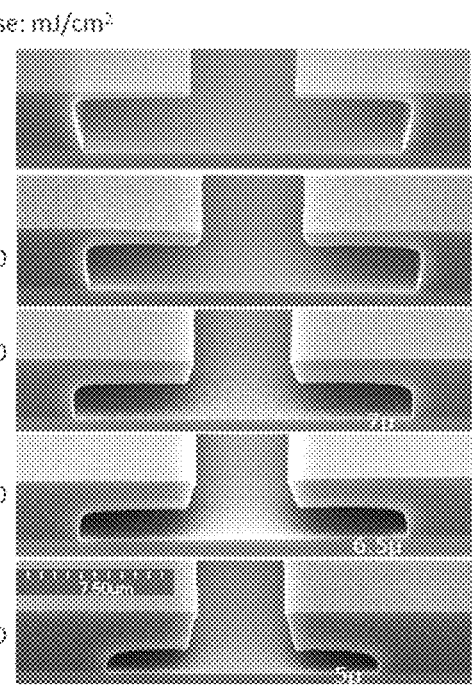
Figure 9:
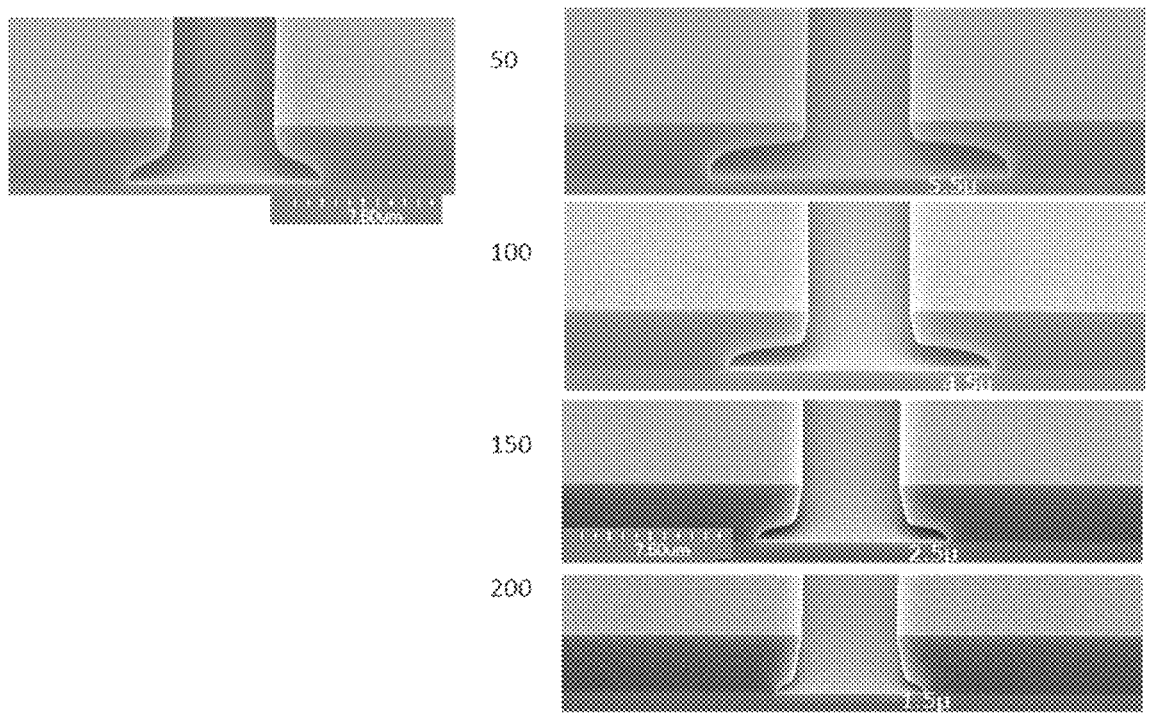

Extended undercut profiles are shown using different quenchers as follows:

FIG. 6, Example 7 using (AI) quencherFIG. 6, Example 8 using (MNNE) quencher FIG. 7, Example 9 using (2EI) quencher FIG. 8, Example 10 using N-Metyldipropylamine quencher FIG. 8, Example 11 using N,N-diisopropylethylamine quenchers FIG. 9, Exaples 12 and 13 using Ttis-isobutylamine quencher

TABLE 9

Quencher's pKa values

| Quencher | pKa |
|---|---|
| Hydroxyethylimidazole (AI) | 6.78 |
| Ethy-limidazole (2EI) | 8.22 |
| Triphenylamine (TPA) | −3.04 |
| 2-(2-methoxyethoxy)-N,N-bis [2-(2-methoxyethoxy)ethyl]-Ethanamine (MNNE) | 6.92 |
| N-Methyldipropylamine | 9.91 |
| N-Methyldiethanolamine (2EI) | 8.81 |
| N,N diisopropylethylamine | 10.98 |
| Tris-isobutylamine | 9.5 |
| Diisopropylaniline (DIPA) | 4.25 |

We claim:

1. A chemically-amplified, negative-acting, photoresist composition, imageable by 365 nm radiation that is developable in aqueous base, the photoresist composition comprising solids components a), b), c) d) and e) and solvent component f);

a) an aqueous base soluble phenolic film-forming polymeric binder resin having ring bonded hydroxyl groups which is a base soluble Novolak, wherein said binder resin, comprises repeat units of structure (2), wherein q is the number of repeat units in a polymer chain,

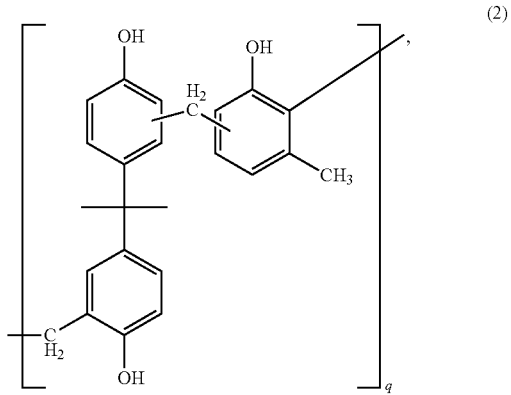

(2)

b) a photoacid generator based on a trihalomethyl derivative, wherein the halo moiety is chlorine or bromine and that forms an acid upon exposure to radiation at 365 nm, in an amount sufficient to initiate crosslinking of the film-forming binder resin;

c) a crosslinking agent that forms a carbonium ion upon exposure to the acid from step b) generated by exposure to radiation, and which comprises an etherified melamine;

d) a dye having a molar attenuation coefficient at 365 nm ranging from about $1.74 \times 10^4$ to about $0.94 \times 10^4$ mole$^{-1}$ L cm$^{-1}$ as measured in PGMEA, which is soluble in aqueous base;

e) a quencher system consisting essentially of an amine quencher, or a mixture of such amine quenchers, having a $pK_a$ in water from about 6.0 to about 12, where the amine quencher has a boiling point of at least 100° C., at 1 atmosphere pressure, and comprises at least one C2-C25 alkyl substituent, a —$(CH_2)_n$OH substituent, or a —$(CH_2)_n$—O—$(CH_2)_{n'}$—O—R' substituent or comprises a mixture of these substituents, where n and n' are independently an integer ranging from 2 to 4 and R' is a C1-C4 alkyl or H;

f) a photoresist solvent.

2. The photoresist composition of claim 1, wherein said solid component e) is one wherein, further, said amine quencher or a mixture of such amine quenchers are ones having structure (1), wherein $R_1$, and $R_{1a}$ may be individually selected from H, a C1 to C5, alkyl, or an aryl, where further at least one of $R_1$, and $R_{1a}$, is C10 to C25 alkyl substituent, or a —$(CH_2)_n$OH substituent, wherein n is an integer ranging from 2 to 4, and further wherein position 3 and 2 are connected by either a single bond or a double bond.

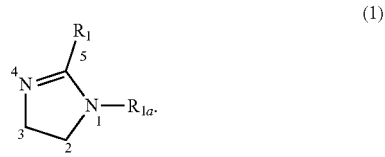

(1)

3. The photoresist composition of claim 2, wherein solid component e), said quencher system is one having one compound of structure (1), is one wherein $R_1$ is a C15 to C20 alkyl moiety, and $R_{1a}$ is C1 to C5 alkyl, and further wherein position 3 and 2 are connected by a single bond.

4. The photoresist composition of claim 2, wherein solid component e), said quencher, having structure (1) is one wherein $R_1$ is a C1 to C5 alkyl moiety, or H and $R_{1a}$ is —$(CH_2)_n$OH, wherein n is an integer ranging from 2 to 4, and further wherein position 3 and 2 are connected by a double bond.

5. The photoresist composition of claim 2, wherein solid component e), said quencher, having structure (1) is one, wherein $R_1$ is a C1 to C3 alkyl moiety, or H and $R_{1a}$ is —$(CH_2)_n$OH, wherein n is an integer ranging from 2 to 4, and further wherein position 3 and 2 are connected by a double bond.

6. The photoresist composition of claim 2, wherein solid component e), said quencher, having structure (1) is one, wherein $R_1$ is H and $R_{1a}$ is —$(CH_2)_n$OH, wherein n is an integer ranging from 2 to 4, and further wherein position 3 and 2 are connected by a double bond.

7. The photoresist composition of claim 2, wherein solid component e), said quencher system consists of a compound of structure (16),

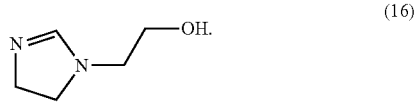

(16)

8. The photoresist composition of claim 2, wherein solid component e), said quencher system is one having one compound of structure (1), is one wherein $R_1$ is a C15 to C20 alkyl moiety, and $R_{1a}$ is C1 to C5 alkyl, and further wherein position 3 and 2 are connected by a double bond.

9. The photoresist composition of claim 1, wherein solid component e), said quencher system, consists only of a compound or a mixture of compounds having structure (17), wherein where n and n' are independently an integer ranging from 2 to 4 and R' is a C1-C4 alkyl or H;

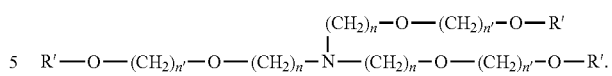

(17)

10. The photoresist composition of claim 1, wherein solid component e), said quencher system consists only of a compound or a mixture of compounds having structure (21), wherein $R_9$ and $R_{10}$ are independently selected from H, or a C-2-C25 alkyl and further wherein at least one of $R_9$ or $R_{10}$ is a C-2-C25 alkyl;

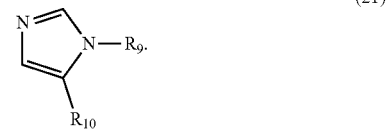

(21)

11. The photoresist composition of claim 1, wherein solid component b), said photoacid generator, is a trihalomethyl derivative of an arene or substituted arene containing from 1 to 3 trihalomethyl substituents.

12. The photoresist composition of claim 1, wherein solid component b), said photoacid generator, is a trihalomethyl derivative of an arene or substituted arene containing from 1 to 3 trihalomethyl substituents which are attached to said arene or substituted arene moiety through a sulfone spacer (—$SO_2$—).

13. The photoresist composition of claim 1, wherein solid component b), said photoacid generator, is a trihalomethyl derivative of a heteroarene or substituted heteroarene containing 1 to 3 trihalomethyl moieties.

14. The photoresist composition claim 1, wherein solid component b), said photoacid generator, is a trihalomethyl derivative of an heteroarene or substituted heteroarene containing from 1 to 3 trihalomethyl substituents which are attached to said heteroarene or substituted heteroarene through a sulfone spacer (—$SO_2$—).

15. The photoresist composition of claim 1, wherein solid component b), said photoacid generator, is a trihalomethyl derivative having structure (3) wherein $R_2$ is a substituted or unsubstituted alkenyl or a substituted or unsubstituted aryl group or a substituted or unsubstituted fused aromatic ring moiety containing 2 to 4 rings and Y is oxygen or nitrogen, and X is Cl or Br;

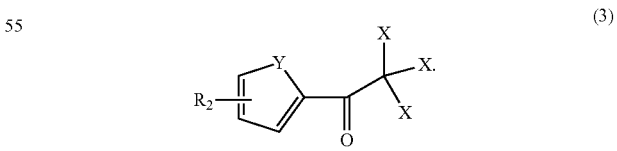

(3)

16. The photoresist composition of claim 1, wherein solid component b), said photoacid generator, is a trihalomethyl derivative of an oxazole or substituted oxazone having structure (4) wherein $R_3$ is a substituted or unsubstituted alkenyl or substituted or unsubstituted aryl group, and X is Cl or Br;

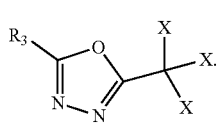

(4)

17. The photoresist composition of claim 1, wherein solid component b), said photoacid generator, is a trihalomethyl derivative of a substituted triazine containing 1 or 2 trihalomethyl moieties.

18. The photoresist composition of claim 1, wherein solid component b), said photoacid generator, is a trihalo methyl derivative having structure (5), wherein X is Br or Cl and $R_4$ is a unsubstituted or substituted alkenyl, an unsubstituted aryl or substituted aryl moiety, or a substituted or unsubstituted fused aromatic ring moiety containing 2 to 4 rings;

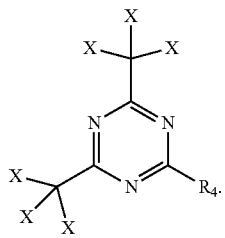

(5)

19. The photoresist composition of claim 1, wherein solid component b), said photoacid generator, is trihalomethyl derivative having structure (7), wherein, o is 1 or 2, X is Cl or Br, and further wherein $R_5$ is a C4 or C5 cyclic aliphatic ether moiety containing one or two olefin bonds which is substituted by hydrogen or a C1 to C2 alkyl,

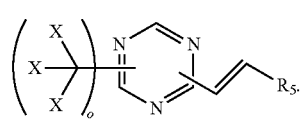

(7)

20. The photoresist composition of claim 1, wherein solid component b), said photoacid generator, is a trihalomethyl derivative having structure (8), wherein, o is 1 or 2, X is Cl or Br and $R_6$ is hydrogen or a C1 to C3 alkyl,

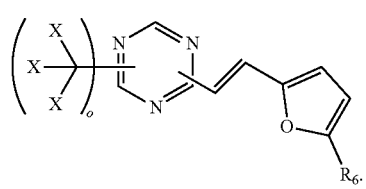

(8)

21. The photoresist composition of claim 1, wherein solid component b), said photoacid generator, is a trihalomethyl derivative having structure (9), wherein X is Cl or Br, and further wherein, $R_6$ is hydrogen or a C1 to C3 alkyl,

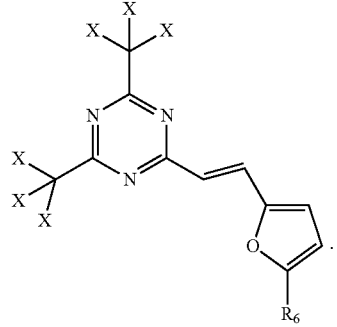

(9)

22. The photoresist composition of claim 1, wherein solid component c), said crosslinking agent, comprises etherified melamines selected from ones having structure (11), oligomers formed by (11) or mixtures of these; wherein $R_7$ is a C1 to C4 alkyl, H or represents a moiety of structure (11a), wherein ∿∿ represents the attachment point of moiety (11a) to structure (11), wherein $R_{7a}$ is a C1 to C4 alkyl, H or represents another moiety of structure (11a),

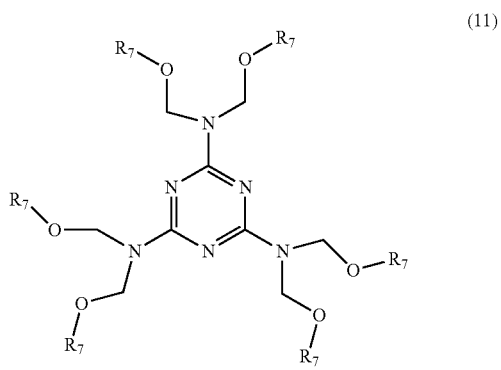

(11)

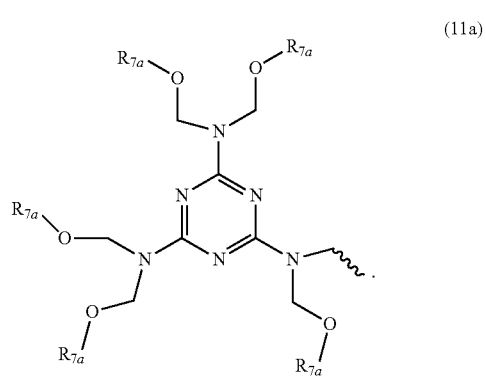

(11a)

23. The photoresist composition of claim 1, wherein solid component d), said dye, is an aqueous base soluble dye having structure (13), wherein m1 and m2, independently, are 1 to 3,

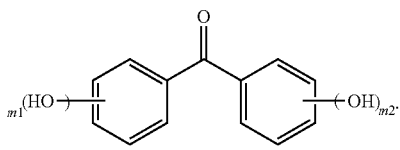
(13)

24. The photoresist composition of claim 1, wherein solid component d), said dye, is an aqueous base soluble dye having structure (14),

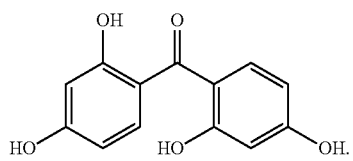
(14)

25. The photoresist composition of claim 2, wherein solid component e), said quencher, having structure (1) is one, wherein $R_1$ is a C15 to C20 alkyl moiety, and $R_{1a}$ is —$(CH_2)_n$OH, wherein n is an integer ranging from 2 to 4, and further wherein position 3 and 2 are connected by a single bond.

26. The photoresist composition of claim 1, wherein solid component e), said quencher system consists only of a compound of structure (15),

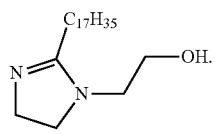
(15)

27. The photoresist composition of claim 1, wherein solid component a) is about 60 to about 90 wt %; solid component b) is about 0.5 to about 8.0 wt %; solid component c) is about 8.0 to about 30 wt %; component d) is about 0.4 to about 8.0 wt %; and solid component e) is about 0.5 to about 4.0 wt %, wherein the total wt % sum, of all the solid components a), b), c), d) and e), does not exceed 100 wt %.

28. A process for imaging a photoresist composition comprising;

a1) coating the photoresist composition of claim 1 onto the surface of a suitable substrate forming a photoresist coating;

b1) heat treating said photoresist coating from step a1) until substantially all of the photoresist solvent is removed from the photoresist composition, forming a photoresist film;

c1) imagewise exposing said photoresist film from step b1) to imaging line radiation to forming an irradiated photoresist film containing exposed and non-exposed regions;

d1) baking said irradiated photoresist film after the exposing step of c1);

e1) removing the unexposed areas of said irradiated photoresist film from step d1) with a developer, forming a substrate covered with undercut photoresist patterns forming a photoresist overhang.

29. A lift-off process for metallization of a patterned photoresist on a substrate comprising;

a2) depositing a layer of metal over said substrate covered with an undercut photoresist patterns from step e1) of claim 28 using metal deposition by EBPVD, CVD deposition or Sputtering, wherein metal deposition over said substrate, covered with an undercut photoresist patterns, deposits metal only on uncovered substrate of said patterned photoresist which are not protected by said photoresist overhang, but further wherein metal deposition occurs elsewhere on the substrate not covered by remaining photoresist, forming a substrate with both selective metal deposition, and a undercut photoresist pattern which is has a coating of metal at the top of the photoresist pattern only (surface metalized resist pattern);

b2) after step a2) stripping said metalized photoresist pattern, resulting in a substrate, wherein metallization has occurred only on the uncovered substrate of said patterned photoresist that is not protected by the overhang of the undercut patterned photoresist.

30. A chemically-amplified, negative-acting, photoresist composition, imageable by 365 nm radiation that is developable in aqueous base, the photoresist composition comprising solids components a), b), c) d) and e) and solvent component f);

a) an aqueous base soluble phenolic film-forming polymeric binder resin having ring bonded hydroxyl groups; said binder resin, comprising repeat units having structure (2), wherein q is the number of repeat units in a polymer chain,

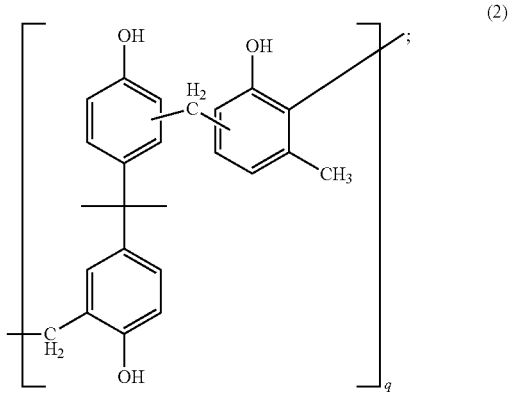
(2)

b) a photoacid generator that forms an acid upon exposure to radiation at 365 nm, in an amount sufficient to initiate crosslinking of the film-forming binder resin wherein said photoacid generator, has structure (10),

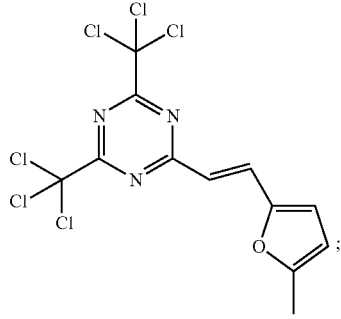

(10)

c) a crosslinking agent that forms a carbonium ion upon exposure to the acid from component b) generated by exposure to radiation, and which comprises an etherified melamine wherein said crosslinking agent, comprises etherified melamines selected from ones having structure (12), oligomers formed by structure (12) or mixtures of these; wherein $R_8$ is methyl, H or represents a moiety of structure (12a), wherein ⌇⌇ represents the attachment point of moiety (12a) to structure (12), wherein $R_{8a}$ is methyl, H or represents another moiety of structure (12a),

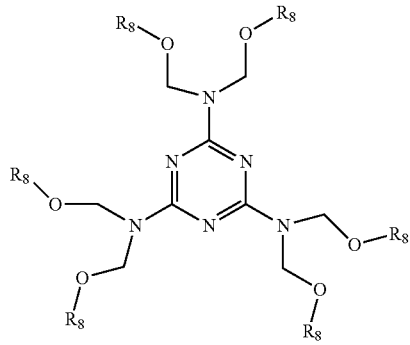

(12)

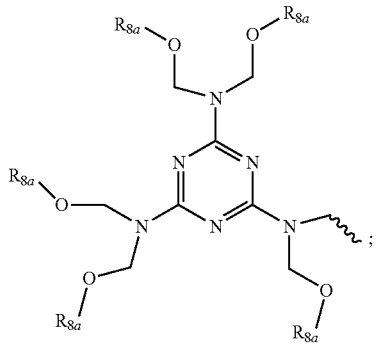

(12a)

d) a dye having structure (14),

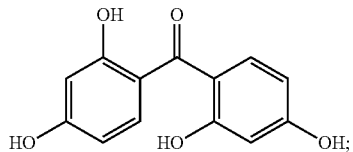

(14)

e) a quencher system consisting essentially of the amine quencher having structure (15),

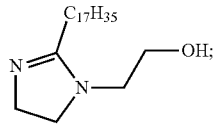

(15)

f) PGMEA.

* * * * *